(12) United States Patent
Kurata et al.

(10) Patent No.: US 8,907,329 B2
(45) Date of Patent: Dec. 9, 2014

(54) ORGANIC EL PANEL, DISPLAY DEVICE USING SAME, AND METHOD FOR PRODUCING ORGANIC EL PANEL

(75) Inventors: Keiko Kurata, Hyogo (JP); Noriyuki Matsusue, Osaka (JP); Kazuhiro Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/818,797

(22) PCT Filed: Nov. 24, 2010

(86) PCT No.: PCT/JP2010/006860
§ 371 (c)(1),
(2), (4) Date: Feb. 25, 2013

(87) PCT Pub. No.: WO2012/070086
PCT Pub. Date: May 31, 2012

(65) Prior Publication Data
US 2013/0146861 A1   Jun. 13, 2013

(51) Int. Cl.
*H01L 29/08*    (2006.01)
*H01L 35/24*    (2006.01)
*H01L 51/00*    (2006.01)
*H01L 21/00*    (2006.01)
*H01L 27/32*    (2006.01)
*H01L 51/52*    (2006.01)
*H01L 51/56*    (2006.01)
*H05B 33/10*    (2006.01)

(52) U.S. Cl.
CPC .......... *H01L 27/322* (2013.01); *H01L 27/3211* (2013.01); *H01L 51/5265* (2013.01); *H01L 51/56* (2013.01); *H05B 33/10* (2013.01); *H01L 2251/558* (2013.01)
USPC .................. 257/40; 257/89; 438/29

(58) Field of Classification Search
USPC ........................................... 257/89
See application file for complete search history.

(56) References Cited

U.S. PATENT DOCUMENTS 5,443,922 A    8/1995  Nishizaki et al.
6,541,130 B2 *  4/2003  Fukuda ................ 428/690

(Continued)

FOREIGN PATENT DOCUMENTS

EP    1862524    12/2007
JP    4-137485    5/1992

(Continued)

OTHER PUBLICATIONS

Office Action from United States patent and Trademark Office (USPTO) in U.S. Appl. No. 13/488,987, dated Jan. 16, 2014.

(Continued)

*Primary Examiner* — Lex Malsawma
(74) *Attorney, Agent, or Firm* — Greenblum & Bernstein, P.L.C.

(57) ABSTRACT

An organic EL panel includes first electrode, second electrode; organic light-emitting layer of each of RGB colors, and functional layer disposed between the first electrode and the light-emitting layer. The functional layers of RGB colors have the same film thickness. Film thickness of each of the functional layers of RG colors corresponds to a first local maximum of light-extraction efficiency of light before passing through a color filter, and film thickness of the functional layer of B color corresponds to a value of light-extraction efficiency smaller than a first local maximum of light-extraction efficiency of light before passing through a color filter. The light-emitting layers of RGB colors differ in film thickness, such that the functional layers of RGB colors have the film thickness. Accordingly, the light of each of RGB colors emitted externally after passing through the color filter exhibits a local maximum of light-extraction efficiency.

21 Claims, 20 Drawing Sheets

(56) References Cited

U.S. PATENT DOCUMENTS

| | | | |
|---|---|---|---|
| 6,737,800 B1 | 5/2004 | Winters et al. | |
| 7,132,789 B2 | 11/2006 | Kobayashi | |
| 7,259,514 B2 | 8/2007 | Murayama et al. | |
| 7,431,997 B2 | 10/2008 | Hwang et al. | |
| 7,518,141 B2* | 4/2009 | Nakamura | 257/40 |
| 7,601,988 B2 | 10/2009 | Seo et al. | |
| 7,605,535 B2 | 10/2009 | Kobayashi | |
| 7,737,627 B2 | 6/2010 | Hwang et al. | |
| 7,741,770 B2 | 6/2010 | Cok et al. | |
| 7,851,989 B2 | 12/2010 | Noda | |
| 7,872,256 B2* | 1/2011 | Sung et al. | 257/40 |
| 7,875,893 B2 | 1/2011 | Seo et al. | |
| 7,960,908 B2 | 6/2011 | Okutani et al. | |
| 7,973,319 B2 | 7/2011 | Kashiwabara et al. | |
| 8,008,852 B2 | 8/2011 | Aratani et al. | |
| 8,021,764 B2 | 9/2011 | Hwang et al. | |
| 8,021,765 B2 | 9/2011 | Hwang et al. | |
| 8,076,687 B2* | 12/2011 | Kobayashi et al. | 257/98 |
| 8,188,315 B2 | 5/2012 | Hwang et al. | |
| 8,188,491 B2 | 5/2012 | Seo et al. | |
| 8,203,158 B2 | 6/2012 | Yoshida et al. | |
| 2003/0044639 A1* | 3/2003 | Fukuda | 428/690 |
| 2005/0099118 A1 | 5/2005 | Kobayashi | |
| 2005/0221124 A1 | 10/2005 | Hwang et al. | |
| 2005/0285508 A1 | 12/2005 | Murayama et al. | |
| 2006/0020136 A1 | 1/2006 | Hwang et al. | |
| 2006/0108919 A1 | 5/2006 | Kobayashi | |
| 2006/0115680 A1 | 6/2006 | Hwang et al. | |
| 2006/0121313 A1 | 6/2006 | Lee et al. | |
| 2006/0232203 A1 | 10/2006 | Noda | |
| 2007/0013282 A1 | 1/2007 | Okutani et al. | |
| 2007/0057264 A1* | 3/2007 | Matsuda | 257/88 |
| 2007/0102737 A1 | 5/2007 | Kashiwabara et al. | |
| 2007/0131948 A1 | 6/2007 | Seo et al. | |
| 2007/0231503 A1 | 10/2007 | Hwang et al. | |
| 2008/0030129 A1 | 2/2008 | Aratani et al. | |
| 2008/0107919 A1 | 5/2008 | Hwang et al. | |
| 2008/0258609 A1* | 10/2008 | Nakamura | 313/504 |
| 2009/0081480 A1 | 3/2009 | Takeda et al. | |
| 2009/0091238 A1 | 4/2009 | Cok et al. | |
| 2009/0278450 A1 | 11/2009 | Sonoyama et al. | |
| 2009/0283786 A1* | 11/2009 | Kobayashi et al. | 257/98 |
| 2010/0006872 A1 | 1/2010 | Seo et al. | |
| 2010/0231484 A1 | 9/2010 | Cok et al. | |
| 2011/0108864 A1 | 5/2011 | Seo et al. | |
| 2011/0140101 A1 | 6/2011 | Noda | |
| 2011/0241038 A1* | 10/2011 | Kashiwabara et al. | 257/89 |
| 2011/0316414 A1 | 12/2011 | Nendai | |
| 2012/0025224 A1 | 2/2012 | Yuasa | |
| 2012/0104423 A1 | 5/2012 | Kurata et al. | |
| 2012/0126272 A1 | 5/2012 | Kurata et al. | |
| 2012/0205688 A1 | 8/2012 | Seo et al. | |
| 2012/0211733 A1 | 8/2012 | Hwang et al. | |
| 2012/0241780 A1 | 9/2012 | Kurata et al. | |

FOREIGN PATENT DOCUMENTS

| | | |
|---|---|---|
| JP | 4-328294 | 11/1992 |
| JP | 5-163488 | 6/1993 |
| JP | 2000-323277 | 11/2000 |
| JP | 2004-014360 | 1/2004 |
| JP | 2004-253389 | 9/2004 |
| JP | 2005-100946 | 4/2005 |
| JP | 2005-116516 | 4/2005 |
| JP | 2005-209421 | 8/2005 |
| JP | 2005-317255 | 11/2005 |
| JP | 2005-322435 | 11/2005 |
| JP | 2006-012579 | 1/2006 |
| JP | 2006-156344 | 6/2006 |
| JP | 2006-173089 | 6/2006 |
| JP | 2006-179780 | 7/2006 |
| JP | 2006-303463 | 11/2006 |
| JP | 2007-027042 | 2/2007 |
| JP | 2007-157732 | 6/2007 |
| JP | 2007-280677 | 10/2007 |
| JP | 2007-318101 | 12/2007 |
| JP | 2008-041925 | 2/2008 |
| JP | 4046948 | 2/2008 |
| JP | 2009-272150 | 11/2009 |
| JP | 2009-277507 | 11/2009 |
| JP | 2010-067482 | 3/2010 |
| JP | 2010-118163 | 5/2010 |
| JP | 2010-251156 | 11/2010 |
| WO | 2009/048520 | 4/2009 |
| WO | 2011/083515 | 7/2011 |

OTHER PUBLICATIONS

Office Action from United States patent and Trademark Office (USPTO) in U.S. Appl. No. 13/819,066, dated Jan. 10, 2014.

Office Action from United States patent and Trademark Office (USPTO) in U.S. Appl. No. 13/819,062, dated Feb. 6, 2014.

United States Office Action in U.S. Appl. No. 13/488,987, dated Jul. 3, 2013.

U.S. Appl. No. 13/488,987 to Keiko Kurata et al., filed Jun. 5, 2012.

U.S. Appl. No. 13/819,059 to Keiko Kurata et al., filed Feb. 26, 2013.

U.S. Appl. No. 13/819,062 to Keiko Kurata et al., filed Feb. 26, 2013.

U.S. Appl. No. 13/819,066 to Keiko Kurata et al., filed Feb. 26, 2013.

International Search Report and Written Opinion in PCT/JP2010/000087, dated Feb. 2, 2010.

International Search Report and Written Opinion in PCT/JP2010/006862, dated Jan. 11, 2011, corrected version.

International Search Report and Written Opinion in PCT/JP2010/006859, dated Jan. 11, 2011.

International Search Report and Written Opinion in PCT/JP2010/006861, dated Jan. 11, 2011.

International Search Report and Written Opinion in PCT/JP2010/006860, dated Jan. 11, 2011.

International Preliminary Report on Patentability in PCT/JP2010/000087, dated Dec. 5, 2011.

Office Action from United States Patent and Trademark Office (USPTO) in U.S. Appl. No. 13/819,066, dated May 6, 2014.

Office Action from United States Patent and Trademark Office (USPTO) in U.S. Appl. No. 13/819,059, dated Apr. 11, 2014.

Advisory Action from United States Patent and Trademark Office (USPTO) in U.S. Appl. No. 13/488,987, dated May 12, 2014.

International Preliminary Report on Patentability in PCT/JP2010/006862, dated Oct. 18, 2012, together with an English language translation thereof.

International Preliminary Report on Patentability in PCT/JP2010/006859, dated Oct. 17, 2012, together with an English language translation thereof.

International Preliminary Report on Patentability in PCT/JP2010/006861, dated Oct. 22, 2012, together with an English language translation thereof.

International Preliminary Report on Patentability in PCT/JP2010/006860, dated Oct. 17, 2012, together with an English language translation thereof.

* cited by examiner

FIG. 6A

Example 1

| | | R | G | B |
|---|---|---|---|---|
| Film thickness (nm) | Electron transport layer | 30 | 30 | 30 |
| | Light-emitting layer | 90 | 70 | 40 |
| | Hole transport layer | 15 | 15 | 15 |
| | Hole injection layer | 5 | 5 | 5 |
| | Transparent conductive layer | 15 | 15 | 15 |
| | | 35 | 35 | 35 |
| Efficiency (cd/A) | | 2.1 | 5.0 | 0.57 |
| Chromaticity (x,y) | | 0.66, 0.34 | 0.28, 0.68 | 0.13, 0.06 |
| Design margin | Tolerable limits | −10 to +10 nm | −9 to +11 nm | −15 to +10 nm |
| | Tolerable margin width | 20 nm (57%) | 20 nm (57%) | 25 nm (71%) |

FIG. 6B

Comparative example 1

| | | R | G | B |
|---|---|---|---|---|
| Film thickness (nm) | Electron transport layer | 30 | 30 | 30 |
| | Light-emitting layer | 80 | 80 | 60 |
| | Hole transport layer | 20 | 9 | 5 |
| | Hole injection layer | 5 | 5 | 5 |
| | Transparent conductive layer | 15 | 15 | 15 |
| | | 40 | 29 | 25 |
| Efficiency (cd/A) | | 2.1 | 5.0 | 0.51 |
| Chromaticity (x,y) | | 0.66, 0.34 | 0.28, 0.68 | 0.13, 0.06 |
| Design margin | Tolerable limits | −11 to +9 nm | −7 to +11 nm | −7 to +11 nm |
| | Tolerable margin width | 20 nm (50%) | 18 nm (62%) | 18 nm (72%) |

FIG. 7

| Efficiency variation in panel (%) | 20 |
|---|---|
| Chromaticity variation in panel | $\Delta x < 0.04$  $\Delta y < 0.04$ |
| Brightness | ≥ 90% @30°<br>≥ 80% @45° |
| Brightness and chromaticity | $\Delta x < 0.04$ @50°<br>$\Delta y < 0.04$ @50° |

FIG. 8A

Example 1 Red

| Film thickness (nm) | | Min | | Ave | | Max | |
|---|---|---|---|---|---|---|---|
| | Electron transport layer | 27 | | 30 | | 33 | |
| | Light-emitting layer | 81 | | 90 | | 99 | |
| | Hole transport layer | 13.5 | 31.5 | 15 | 35 | 16.5 | 38.5 |
| | Hole injection layer | 4.5 | | 5 | | 5.5 | |
| | Transparent conductive layer | 13.5 | | 15 | | 16.5 | |

FIG. 8B

Example 1 Green

| Film thickness (nm) | | Min | | Ave | | Max | |
|---|---|---|---|---|---|---|---|
| | Electron transport layer | 27 | | 30 | | 33 | |
| | Light-emitting layer | 63 | | 70 | | 77 | |
| | Hole transport layer | 13.5 | 31.5 | 15 | 35 | 16.5 | 38.5 |
| | Hole injection layer | 4.5 | | 5 | | 5.5 | |
| | Transparent conductive layer | 13.5 | | 15 | | 16.5 | |

FIG. 8C

Example 1 Blue

| Film thickness (nm) | | Min | | Ave | | Max | |
|---|---|---|---|---|---|---|---|
| | Electron transport layer | 27 | | 30 | | 33 | |
| | Light-emitting layer | 36 | | 40 | | 44 | |
| | Hole transport layer | 13.5 | 31.5 | 15 | 35 | 16.5 | 38.5 |
| | Hole injection layer | 4.5 | | 5 | | 5.5 | |
| | Transparent conductive layer | 13.5 | | 15 | | 16.5 | |

FIG. 10A

Example 2

| | | R | | | G | | | B | | |
|---|---|---|---|---|---|---|---|---|---|---|
| Film thickness (nm) | Electron transport layer | 30 | | | 30 | | | 30 | | |
| | Light-emitting layer | 90 | | | 80 | | | 40 | | |
| | Hole transport layer | 10 | | | 10 | | | 10 | | |
| | Hole injection layer | 5 | | | 5 | | | 5 | | |
| | Transparent conductive layer | 20 | | 35 | 20 | | 35 | 20 | | 35 |
| Efficiency (cd/A) | | 1.8 | | | 4.7 | | | 0.58 | | |
| Chromaticity (x, y) | | 0.66, 0.34 | | | 0.28, 0.67 | | | 0.13, 0.06 | | |
| Design margin | Tolerable limits | −10 to +12 nm | | | −10 to +17 nm | | | −6 to +9 nm | | |
| | Tolerable margin width | 22 nm (62%) | | | 27 nm (77%) | | | 15 nm (42%) | | |

FIG. 10B

Comparative example 2

| | | R | | | G | | | B | | |
|---|---|---|---|---|---|---|---|---|---|---|
| Film thickness (nm) | Electron transport layer | 30 | | | 30 | | | 30 | | |
| | Light-emitting layer | 80 | | | 80 | | | 60 | | |
| | Hole transport layer | 25 | | | 16 | | | 9 | | |
| | Hole injection layer | 5 | | | 5 | | | 5 | | |
| | Transparent conductive layer | 20 | | 50 | 20 | | 41 | 20 | | 34 |
| Efficiency (cd/A) | | 1.9 | | | 4.7 | | | 0.49 | | |
| Chromaticity (x, y) | | 0.66, 0.34 | | | 0.28, 0.67 | | | 0.13, 0.06 | | |
| Design margin | Tolerable limits | −13 to +13 nm | | | −17 to +11 nm | | | −9 to +11 nm | | |
| | Tolerable margin width | 26 nm (52%) | | | 28 nm (68%) | | | 20 nm (59%) | | |

FIG. 11A

Example 2 Red

| | | Min | Ave | Max |
|---|---|---|---|---|
| Film thickness (nm) | Electron transport layer | 27 | 30 | 33 |
| | Light-emitting layer | 81 | 90 | 99 |
| | Hole transport layer | 9 | 10 | 11 |
| | Hole injection layer | 4.5 | 5 | 5.5 |
| | Transparent conductive layer | 18 | 20 | 22 |
| | | 31.5 | 35 | 38.5 |

FIG. 11B

Example 2 Green

| | | Min | Ave | Max |
|---|---|---|---|---|
| Film thickness (nm) | Electron transport layer | 27 | 30 | 33 |
| | Light-emitting layer | 72 | 80 | 88 |
| | Hole transport layer | 9 | 10 | 11 |
| | Hole injection layer | 4.5 | 5 | 5.5 |
| | Transparent conductive layer | 18 | 20 | 22 |
| | | 31.5 | 35 | 38.5 |

FIG. 11C

Example 2 Blue

| | | Min | Ave | Max |
|---|---|---|---|---|
| Film thickness (nm) | Electron transport layer | 27 | 30 | 33 |
| | Light-emitting layer | 36 | 40 | 44 |
| | Hole transport layer | 9 | 10 | 11 |
| | Hole injection layer | 4.5 | 5 | 5.5 |
| | Transparent conductive layer | 18 | 20 | 22 |
| | | 31.5 | 35 | 38.5 |

FIG. 13A

Example 3

| | | R | G | B |
|---|---|---|---|---|
| Film thickness (nm) | Electron transport layer | 30 | 30 | 30 |
| | Light-emitting layer | 60 | 40 | 100 |
| | Hole transport layer | 15 | 15 | 90 |
| | Hole injection layer | 5 | 5 | 5 |
| | Transparent conductive layer | 30 | 30 | 30 |
| | | 50 | 50 | 125 |
| Efficiency (cd/A) | | 2.1 | 5.0 | 0.51 |
| Chromaticity (x, y) | | 0.66, 0.34 | 0.28, 0.68 | 0.13, 0.06 |
| Design margin | Tolerable limits | −4 to +15 nm | −8 to +15 nm | − |
| | Tolerable margin width | 19 nm (38%) | 23 nm (46%) | 0 nm (0%) |

FIG. 13B

Comparative example 3

| | | R | G | B |
|---|---|---|---|---|
| Film thickness (nm) | Electron transport layer | 30 | 30 | 30 |
| | Light-emitting layer | 50 | 50 | 50 |
| | Hole transport layer | 20 | 10 | 110 |
| | Hole injection layer | 5 | 5 | 5 |
| | Transparent conductive layer | 30 | 30 | 30 |
| | | 55 | 45 | 145 |
| Efficiency (cd/A) | | 2.0 | 5.2 | 0.51 |
| Chromaticity (x, y) | | 0.66, 0.34 | 0.28, 0.68 | 0.13, 0.06 |
| Design margin | Tolerable limits | −5 to +16 nm | −9 to +11 nm | − |
| | Tolerable margin width | 21 nm (38%) | 20 nm (44%) | 0 nm (0%) |

FIG. 14A

| Example 3 Red | | Min | Ave | Max |
|---|---|---|---|---|
| Film thickness (nm) | Electron transport layer | 27 | 30 | 33 |
| | Light-emitting layer | 54 | 60 | 66 |
| | Hole transport layer | 13.5 | 15 | 16.5 |
| | Hole injection layer | 4.5 | 5 | 5.5 |
| | Transparent conductive layer | 27 | 30 | 33 |
| | | 45 | 50 | 55 |

FIG. 14B

| Example 3 Green | | Min | Ave | Max |
|---|---|---|---|---|
| Film thickness (nm) | Electron transport layer | 27 | 30 | 33 |
| | Light-emitting layer | 36 | 40 | 44 |
| | Hole transport layer | 13.5 | 15 | 16.5 |
| | Hole injection layer | 4.5 | 5 | 5.5 |
| | Transparent conductive layer | 27 | 30 | 33 |
| | | 45 | 50 | 55 |

FIG. 14C

| Example 3 Blue | | Min | Ave | Max |
|---|---|---|---|---|
| Film thickness (nm) | Electron transport layer | 27 | 30 | 33 |
| | Light-emitting layer | 90 | 100 | 110 |
| | Hole transport layer | 81 | 90 | 99 |
| | Hole injection layer | 4.5 | 5 | 5.5 |
| | Transparent conductive layer | 27 | 30 | 33 |
| | | 112.5 | 125 | 137.5 |

FIG. 16

| | Transparent conductive layer | Hole transport layer | Hole injection layer | L | $\phi/(2\pi)$ | $2L/\lambda$ | m | Degree |
|---|---|---|---|---|---|---|---|---|
| Red | 30 nm | 15 nm | 5 nm | 103.4 | −0.43 | 0.44 | 0.0 | 1 |
| Green | 30 nm | 15 nm | 5 nm | 92.5 | −0.44 | 0.40 | 0.0 | 1 |
| Blue | 30 nm | 90 nm | 5 nm | 223.9 | −0.47 | 0.96 | 0.5 | 1.5 |

ORGANIC EL PANEL, DISPLAY DEVICE USING SAME, AND METHOD FOR PRODUCING ORGANIC EL PANEL

TECHNICAL FIELD

The present invention relates to an organic EL panel that relies on electroluminescence phenomenon of organic materials, a display device with the organic EL panel, and a method of manufacturing the organic EL panel. The present invention particularly relates to optical design for increasing light-extraction efficiency of each of R (Red), G (Green), and B (Blue) colors.

BACKGROUND ART

In recent years, there has been proposed adoption of organic EL (Electro Luminescence) panels that rely on electroluminescence phenomenon of organic materials as display panels for display devices such as digital televisions. A matrix of respective organic EL elements of the R, G, and B colors is arranged in a substrate of an organic EL panel.

It is important to increase light-extraction efficiency of the respective organic EL elements of the R, G, and B colors, from the standpoint of reducing power consumption, increasing service life of the organic EL panels, and the like. To this end, there has been proposed a number of arts for increasing light-extraction efficiency owing to creativity of optical design of the organic EL elements (see Patent Literatures 1 to 6). For example, Patent Literature 1 discloses that respective light-emitting elements of the R, G, and B colors are each constituted from a first layer generating holes, a second layer including a light-emitting layer of a corresponding color, and a third layer generating electrons that are provided between a first electrode reflecting light and a second electrode transmitting incident light therethrough, where the first layer differs in film thickness among the R, G, and B colors. According to Patent Literature 1, light-extraction efficiency increases due to light interference phenomenon when the optical distance between the first electrode and the second layer is $(2m-1)/4$ times a light-emitting wavelength, where m is an arbitrary positive integer.

Also, it is important not only to increase the light-extraction efficiency of the organic EL panel but also to increase color reproducibility of the organic EL panel. In order to increase the color reproducibility, chromaticity of light of each of the R, G, and B colors needs to be approximated to a target chromaticity. In view of this, a color filter for each of the R, G, and B colors is provided to reduce unnecessary component of color and adjust the chromaticity of light.

CITATION LIST

Patent Literature

[Patent Literature 1] Japanese Patent Application Publication No. 2006-156344
[Patent Literature 2] Japanese Patent Application Publication No. 2005-317255
[Patent Literature 3] Japanese Patent Application Publication No. 2005-322435
[Patent Literature 4] Japanese Patent Application Publication No. 2005-100946
[Patent Literature 5] Japanese Patent Application Publication No. 2008-41925
[Patent Literature 6] Japanese Patent Application Publication No. 2006-179780

SUMMARY OF INVENTION

Technical Problem

However, researches made by the present inventors proved that it is difficult to realize both the increase in light-extraction efficiency and the increase in color reproducibility just by designing the film thickenss of each layer so as to maximally increase light interference phenomenon and then designing a color filter so as to increase color purity. Also, the light-extraction efficiency of the B color is lower than the respective light-extraction efficiencies of the R and G colors. A problem for practical use of organic EL panels is to improve especially the light-extraction efficiency of the B color.

In view of this, the present invention aims to provide an organic EL panel, a display device with use of the organic EL panel, and a method of manufacturing the organic EL panel according to which both the increase in light-extraction efficiency and the increase in color reproducibility are realized, and the light-extraction efficiency of the B color is improved.

Solution to Problem

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a functional layer of each of the R, G, and B colors that is disposed between the first electrode of a corresponding color and the organic light-emitting layer of a corresponding color; a color filter of each of the R, G, and B colors that is disposed opposite the organic light-emitting layer of a corresponding color with the second electrode being interposed therebetween, wherein a first portion of light of each of the R, G, and B colors emitted from the organic light-emitting layer of a corresponding color travels through the functional layer of a corresponding color towards the first electrode of a corresponding color, strikes and is reflected by the first electrode of the corresponding color, and then is emitted externally after passing through the functional layer of the corresponding color, the organic light-emitting layer of the corresponding color, the second electrode, and the color filter of a corresponding color, a second portion of the light of each of the R, G, and B colors travels towards the second electrode instead of towards the first electrode of the corresponding color, and is emitted externally after passing through the second electrode and the color filter of the corresponding color, the respective functional layers of the R, G, and B colors are equal in film thickness to one another, the film thickness of each of the respective functional layers of the R and G colors corresponds to a first local maximum of light-extraction efficiency with respect to the light of the corresponding color before passing through the color filter of the corresponding color, the film thickness of the functional layer of the B color corresponds to a value of light-extraction efficiency that is smaller than a first local maximum of light-extraction efficiency with respect to the light of the B color before passing through the color filter of the B color, the respective organic light-emitting layers of the R, G, and B colors differ in film thickness from one another, such that the respective functional layers of the R, G, and B colors are equal in film thickness to one another, and the light of each of the R, G, and B colors emitted externally after passing through the color filter of the corresponding color exhibits a first local maximum of light-extraction efficiency.

Advantageous Effects of Invention

According to the one aspect of the present invention, light of each of the R, G, and B colors emitted externally after passing through a color filter of a corresponding color exhibits the first local maximum of light-extraction efficiency. Since the light emitted externally has passed through the color filter, the chromaticity has been already approximated to a target chromaticity. The first local maximum of the light-extraction efficiency appears with respect to the light whose chromaticity has been approximated to the target chromaticity. This realizes both the increase in light-extraction efficiency and the increase in color reproducibility.

BRIEF DESCRIPTION OF DRAWINGS

FIG. 4A shows a case where no CF is used in Example 1, FIG. 4B shows a case where CFs are used in Example 1, FIG. 4C shows a case where no CF is used in Comparative example 1, and FIG. 4D shows a case where CFs are used in Comparative example 1.

FIG. 5A and FIG. 5B show variation of light-extraction efficiency when varying the film thickness of a hole transport layer, in the case where no CF is used and the case where CFs are used, respectively, and FIG. 5C and FIG. 5D show variation of light-extraction efficiency when varying the film thickness of an organic light-emitting layer, in the case where no CF is used and the case where CFs are used, respectively.

FIG. 6A and FIG. 6B show light-extraction efficiency and so on when a hole transport layer is set to have an optimal film thickness in Example 1 and Comparative example 1, respectively.

FIG. 7 show allowable ranges.

FIG. 8A to FIG. 8C each show the minimum value, the average value, and the maximum value of the film thickness of each layer constituting the organic EL element in Example 1, with respect to the R, G, and B colors, respectively.

FIG. 9A shows a case where no CF is used in Example 2, FIG. 9B shows a case where CFs are used in Example 2, FIG. 9C shows a case where no CF is used in Comparative example 2, and FIG. 9D shows a case where CFs are used in Comparative example 2.

FIG. 10A and FIG. 10B show light-extraction efficiency and so on when a hole transport layer is set to have an optimal film thickness in Example 2 and Comparative example 2, respectively.

FIG. 11A to FIG. 11C each show the minimum value, the average value, and the maximum value of the film thickness of each layer constituting an organic EL element in Example 2, with respect to the R, G, and B colors, respectively.

FIG. 12A shows a case where no CF is used in Example 3, FIG. 12B shows a case where CFs are used in Example 3, FIG. 12C shows a case where no CF is used in Comparative example 3, and FIG. 12D shows a case where CFs are used in Comparative example 3.

FIG. 13A and FIG. 13B show light-extraction efficiency and so on when a hole transport layer is set to have an optimal film thickness in Example 3 and Comparative example 3, respectively.

FIG. 14A to FIG. 14C each show the minimum value, the average value, and the maximum value of the film thickness of each layer constituting an organic EL element in Example 3, with respect to the R, G, and B colors, respectively.

FIG. 16 shows parameters used in Equation 1 in Example 3.

DESCRIPTION OF EMBODIMENTS

Figure 1:
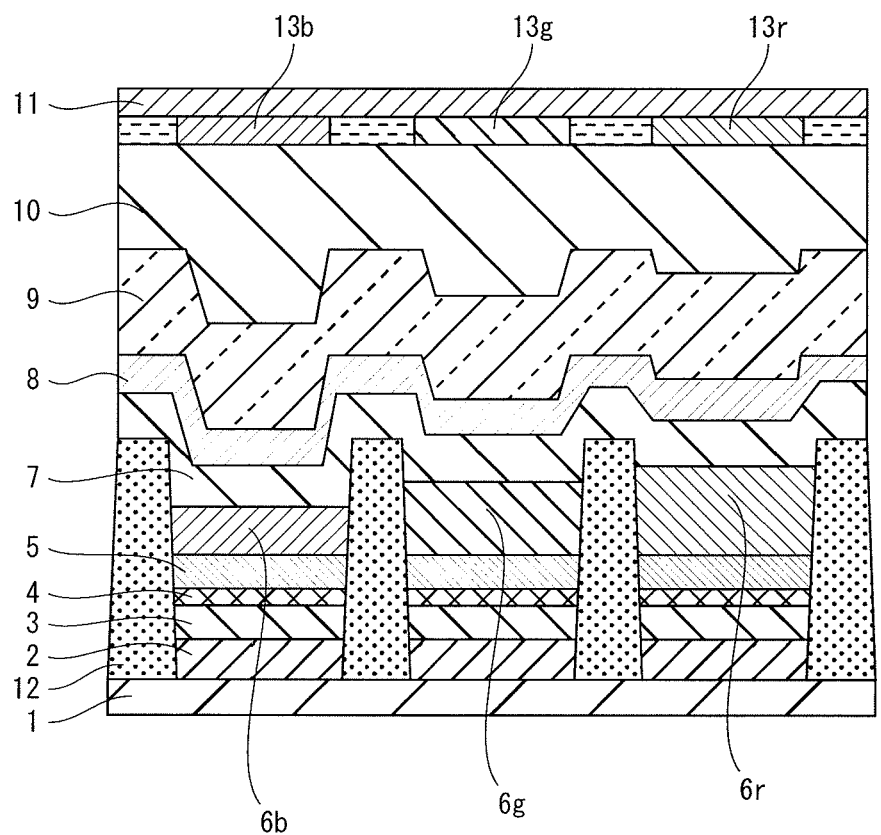
FIG. 1 is a cross-sectional diagram schematically showing the pixel structure of an organic EL panel according to an embodiment of the present invention.

[Process by which Aspect of the Present Invention was Achieved]

According to an organic EL panel having the structure in which an organic light-emitting layer is disposed between a first electrode that reflects light and a second electrode that transmits light therethrough and a functional layer is disposed between the first electrode and the organic light-emitting layer, two optical paths are formed. Specifically, one is a first optical path in which a portion of light emitted from the organic light-emitting layer travels towards the first electrode, strikes and is reflected by the first electrode, and then is emitted externally after passing through the functional layer, the organic light-emitting layer, and the second electrode. The other is a second optical path in which a remaining portion of the light emitted from the organic light-emitting layer travels towards the second electrode instead of towards the first electrode, and then is emitted externally after passing through the second electrode. According to such an organic EL panel, the increase in film thickness of the functional layer starting from zero causes cyclic variation of the light-extraction efficiency due to light interference phenomenon. Here, a local maximum of light-extraction efficiency that appears is referred to as the first local maximum, the second local maximum, and the third local maximum, . . . , in order of increasing film thickness of the functional layer. Conventionally, there has been known that the film thickness of the functional layer should be set so as to correspond to a local maximum of light-extraction efficiency (see Patent Literature 1).

However, the researches made by the present inventors proved as follows. Variation of the film thickness of the functional layer causes not only variation of the light-extraction efficiency but also variation of the chromaticity. Also, it is not always true that when a local maximum of light-extraction efficiency appears, a current chromaticity is approximate to a target chromaticity. Furthermore, such a tendency is evident with respect to blue light in a short wavelength region. The more greatly the current chromaticity differs from the target chromaticity, the more chromaticity correction needs to be made with use of CFs. As a result, there is a case where though a chromaticity before chromaticity correction corresponds to a local maximum of light-extraction efficiency, a chromaticity after the chromaticity correction does not correspond to a local maximum of light-extraction efficiency. Conversely, there is a case where though a chromaticity before chromaticity correction does not correspond to a local maximum of light-extraction efficiency, a chromaticity after the chromaticity correction corresponds to a local maximum of light-extraction efficiency.

In view of the above circumstances, it is clear that, especially with respect to blue light, the film thickness of a layer is preferably optimized in consideration of the characteristics of the CF for chromaticity correction (hereinafter, "CF characteristics"). The one aspect of the present invention was achieved based on the new expertise described above.

[Outline of Aspects of the Present Invention]

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a functional layer of each of the R, G, and B colors that is disposed between the first electrode of a corresponding color and the organic light-emitting layer of a corresponding color; a color filter of each of the R, G, and B colors that is disposed opposite the organic light-emitting layer of a corresponding color with the second electrode being interposed therebetween, wherein a first portion of light of each of the R, G, and B colors emitted from the organic light-emitting layer of a corresponding color travels through the functional layer of a corresponding color towards the first electrode of a corresponding color, strikes and is reflected by the first electrode of the corresponding color, and then is emitted externally after passing through the functional layer of the corresponding color, the organic light-emitting layer of the corresponding color, the second electrode, and the color filter of a corresponding color, a second portion of the light of each of the R, G, and B colors travels towards the second electrode instead of towards the first electrode of the corresponding color, and is emitted externally after passing through the second electrode and the color filter of the corresponding color, the respective functional layers of the R, G, and B colors are equal in film thickness to one another, the film thickness of each of the respective functional layers of the R and G colors corresponds to a first local maximum of light-extraction efficiency with respect to the light of the corresponding color before passing through the color filter of the corresponding color, the film thickness of the functional layer of the B color corresponds to a value of light-extraction efficiency that is smaller than a first local maximum of light-extraction efficiency with respect to the light of the B color before passing through the color filter of the B color, the respective organic light-emitting layers of the R, G, and B colors differ in film thickness from one another, such that the respective functional layers of the R, G, and B colors are equal in film thickness to one another, and the light of each of the R, G, and B colors emitted externally after passing through the color filter of the corresponding color exhibits a first local maximum of light-extraction efficiency.

According to the one aspect of the present invention, light of each of the R, G, and B colors emitted externally after passing through a color filter of a corresponding color exhibits the first local maximum of light-extraction efficiency. Since the light emitted externally has passed through the color filter, the chromaticity has been already approximated to a target chromaticity. The first local maximum of the light-extraction efficiency appears with respect to the light whose chromaticity has been approximated to the target chromaticity. This realizes both the increase in light-extraction efficiency and the increase in color reproducibility.

Generally, the organic light-emitting layer needs to be formed separately for each of the R, G, and B colors irrespective of whether having the same film thickness among the R, G, and B colors, because of being formed from a different material for each of the R, G, and B colors. Compared with this, the functional layer is formed from the same material among the R, G, and B colors. Accordingly, as long as the functional layer has the same film thickness among the R, G, and B colors, the functional layer does not need to be formed separately for each of the R, G, and B colors. According to the organic EL panel that is the one aspect of the present invention, the respective functional layers of the R, G, and B colors have the same film thickness, and the respective organic light-emitting layers of the R, G, and B colors each have a different film thickness. In other words, film thickness adjustment for each of the R, G, and B colors is made by adjusting the film thickness of only the organic light-emitting layer which originally needs to be formed separately for each of the R, G, and B colors. As a result, it is possible to simplify the manufacturing process compared with conventional arts.

Note that "light-extraction efficiency with respect to light before passing through the color filter" indicates light-extraction efficiency only in consideration of the film thickness of the functional layer and no consideration of the CF characteristics, that is, light-extraction efficiency based on the assumption that no CF is used.

Also, the film thickness of the functional layer of the B color may be thinner than a film thickness corresponding to the first local maximum of light-extraction efficiency with respect to the light of the B color before passing through the color filter of the B color.

The researches made by the present inventors proved that, with respect to the R and G colors, in the case where the film thickness of the functional layer is adjusted so as to correspond to the first local maximum of light-extraction efficiency with respect to light with no CF, a local maximum of light-extraction efficiency appears also in the case where the CF is used. The researches also proved that the first local maximum corresponding to the film thickness of the functional layer has a large value compared with the case where the film thickness of the functional layer is adjusted so as to correspond to a local maximum with other degree. Also, the researches proved that in the case where the film thickness of the functional layer of the B color is adjusted so as to be thinner than the film thickness corresponding to the first local maximum, the use of a color filter causes appearance of a local maximum of light-extraction efficiency. According to the organic EL panel that is the one aspect of the present invention, the film thickness of each of the respective functional layers of the R and G colors is adjusted so as to correspond to the first local maximum, and the film thickness of the functional layer of the B color is adjusted so as to be thinner than a film thickness corresponding to the first local maximum. This increases more the light-extraction efficiency in the case where color filters are used.

Also, the respective organic light-emitting layers of the R, G, and B colors may have a film thickness of 81 nm to 99 nm, a film thickness of 63 nm to 77 nm, a film thickness of 36 nm to 44 nm, respectively, and the respective functional layers of the R, G, and B colors each may have a film thickness of 31.5 nm to 38.5 nm.

Also, the functional layer of each of the R, G, and B colors may include a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each may have a film thickness of 13.5 nm to 16.5 nm, the respective hole injection layers of the R, G, and B colors each may have a film thickness of 4.5 nm to 5.5 nm, and the respective hole transport layers of the R, G, and B colors each may have a film thickness of 13.5 nm to 16.5 nm.

Also, the first electrode of each of the R, G, and B colors may be formed from silver or alloy of silver, and the transparent conductive layer of each of the R, G, and B colors may be formed from ITO (Indium Tin Oxide).

Also, the respective organic light-emitting layers of the R, G, and B colors may have a film thickness of 81 nm to 99 nm, a film thickness of 72 nm to 88 nm, a film thickness of 36 nm to 44 nm, respectively, and the respective functional layers of the R, G, and B colors each may have a film thickness of 31.5 nm to 38.5 nm.

Also, the functional layer of each of the R, G, and B colors may include a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each may have a film thickness of 18 nm to 22 nm, the respective hole injection layers of the R, G, and B colors each chave a film thickness of 4.5 nm to 5.5 nm, and the respective hole transport layers of the R, G, and B colors each may have a film thickness of 9 nm to 11 nm.

Also, the first electrode of each of the R, G, and B colors may be formed from aluminum or alloy of aluminum, and the transparent conductive layer of each of the R, G, and B colors may be formed from IZO (Indium Zinc Oxide).

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a functional layer of each of the R, G, and B colors that is disposed between the first electrode of a corresponding color and the organic light-emitting layer of a corresponding color; a color filter of each of the R, G, and B colors that is disposed opposite the organic light-emitting layer of a corresponding color with the second electrode being interposed therebetween, wherein a first portion of light of each of the R, G, and B colors emitted from the organic light-emitting layer of a corresponding color travels through the functional layer of a corresponding color towards the first electrode of a corresponding color, strikes and is reflected by the first electrode of the corresponding color, and then is emitted externally after passing through the functional layer of the corresponding color, the organic light-emitting layer of the corresponding color, the second electrode, and the color filter of a corresponding color, a second portion of the light of each of the R, G, and B colors travels towards the second electrode instead of towards the first electrode of the corresponding color, and is emitted externally after passing through the second electrode and the color filter of the corresponding color, the respective functional layers of the R and G colors are equal in film thickness to each other, and differ in film thickness from the functional layer of the B color, with respect to the light of the corresponding color before passing through the color filter of the corresponding color, the film thickness of each of the respective functional layers of the R and G colors corresponds to a first local maximum of light-extraction efficiency, with respect to the light of the B color before passing through the color filter of the B color, the film thickness of the functional layer of the B color corresponds to a value of light-extraction efficiency that is smaller than a first local maximum of light-extraction efficiency and is larger than a second local maximum of light-extraction efficiency, where the first local maximum of light-extraction efficiency is larger than the second local maximum of light-extraction efficiency, the respective organic light-emitting layers of the R, G, and B colors differ in film thickness from one another, such that the respective functional layers of the R and G colors are equal in film thickness to each other, and differ in film thickness from the functional layer of the B color, and the light of each of the R, G, and B colors emitted externally after passing through the color filter of the corresponding color exhibits a first local maximum of light-extraction efficiency.

According to the one aspect of the present invention, light of each of the R, G, and B colors emitted externally after passing through a color filter of a corresponding color exhibits the first local maximum of light-extraction efficiency. Since the light emitted externally has passed through the color filter, the chromaticity has been already approximated to a target chromaticity. The first local maximum of the light-extraction efficiency appears with respect to the light whose chromaticity has been approximated to the target chromaticity. This realizes both the increase in light-extraction efficiency and the increase in color reproducibility.

Also, with respect to the light of the B color before passing through the color filter of the B color, the film thickness of the functional layer of the B color may be thicker than a film thickness corresponding to the first local maximum of light-extraction efficiency and may be thinner than a film thickness corresponding to the second local maximum of light-extraction efficiency.

The researches made by the present inventors proved that, with respect to the R and G colors, in the case where the film thickness of the functional layer is adjusted so as to correspond to the first local maximum, a local maximum of light-extraction efficiency appears in the case where CFs are used. The researches also proved that the film thickness of the functional layer is adjusted so as to correspond to a local maximum having a large value compared with the case where the film thickness of the functional layer is adjusted so as to correspond to a local maximum with other degree. Also, the researches proved that in the case where the film thickness of the functional layer of the B color is adjusted so as to be thicker than a film thickness corresponding to the first local maximum and thinner than a film thickness corresponding to the second local maximum, the use of a color filter causes appearance of a local maximum of light-extraction efficiency. According to the organic EL panel that is the one aspect of the present invention, the film thickness of each of the respective functional layers of the R and G colors is adjusted so as to correspond to the first local maximum, and the film thickness of the functional layer of the B color is adjusted so as to be thicker than a film thickness corresponding to the first local maximum and thinner than a film thickness corresponding to the second local maximum. This increases more the light-extraction efficiency in the case where color filters are used.

Also, the functional layer of each of the R, G, and B colors may include a layer formed by a printing method and a layer formed by a physical vapor deposition method, the respective layers of the R and G colors formed by the printing method may be equal in film thickness to each other, and differ in film thickness from the layer of the B color formed by the printing method, and the respective layers of the R, G, and B colors formed by the physical vapor deposition method may be equal in film thickness to one another.

Generally, the organic light-emitting layer needs to be formed separately for each of the R, G, and B colors irrespective of whether having the same film thickness among the R, G, and B colors, because of being formed from a different material for each of the R, G, and B colors. The functional layer is formed from the same material among the R, G, and B colors. Accordingly, as long as the functional layer has the same film thickness among the R, G, and B colors, the functional layer does not need to be formed separately for each of the R, G, and B colors. Also, the printing method facilitates film formation for each of the R, G, and B colors, compared with the physical vapor deposition method. According to the organic EL panel that is the one aspect of the present invention, adjustment of film thickness for each of the R, G, and B colors is made on the organic functional layer, which originally needs to be formed separately for each of the R, G, and B colors and a layer formed by the printing method according to which film formation for each of the R, G, and B colors is easily made. As a result, it is possible to simplify the manufacturing process.

Also, the respective organic light-emitting layers of the R, G, and B colors may have a film thickness of 54 nm to 66 nm, a film thickness of 36 nm to 44 nm, a film thickness of 90 nm to 110 nm, respectively, and the respective functional layers of the R and G colors each may have a film thickness of 45 nm to 55 nm, and the functional layer of the B color has a film thickness of 112.5 nm to 137.5 nm.

Also, the functional layer of each of the R, G, and B colors may include a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each may have a film thickness of 27 nm to 30 nm, the respective hole injection layers of the R, G, and B colors each may have a film thickness of 4.5 nm to 5.5 nm, and the respective hole transport layers of the R and G colors each may have a film thickness of 13.5 nm to 16.5 nm, and the hole transport layer of the B color has a film thickness of 81 nm to 99 nm.

Also, the first electrode of each of the R, G, and B colors may be formed from aluminum or alloy of aluminum, and the transparent conductive layer of each of the R, G, and B colors may be formed from IZO (Indium Zinc Oxide).

Also, the organic light-emitting layer of each of the R, G, and B colors may contain an organic material, and may be formed by a printing method.

One aspect of the present invention provides a display device with use of the above organic EL panel.

One aspect of the present invention provides a method of manufacturing an organic EL panel, comprising: a first step of preparing a first electrode of each of R (red), G (green), and B (blue) colors that reflects incident light; a second step of disposing a functional layer of each of the R, G, and B colors on the first electrode of a corresponding color; a third step of disposing an organic light-emitting layer that emits light of each of the R, G, and B colors on the functional layer of a corresponding color; a fourth step of disposing a second electrode that transmits incident light therethrough on the respective organic light-emitting layers of the R, G, and B colors so as to face the respective first electrodes of the R, G, and B colors; and a fifth step of disposing a color filter of each of the R, G, and B colors so as to be opposite the organic light-emitting layer of a corresponding color with the second electrode being interposed therebetween, wherein in the second step, the functional layer is disposed, such that (i) the respective functional layers of the R, G, and B colors are equal in film thickness to one another, the film thickness of each of the respective functional layers of the R and G colors corresponds to a first local maximum of light-extraction efficiency with respect to the light of the corresponding color before passing through the color filter of the corresponding color, and (ii) the film thickness of the functional layer of the B color corresponds to a value of light-extraction efficiency that is smaller than a first local maximum of light-extraction efficiency with respect to the light of the B color before passing through the color filter of the B color, and in the third step, the organic light-emitting layer is disposed, such that (i) the respective organic light-emitting layers of the R, G, and B colors differ in film thickness from one another such that the respective functional layers of the R, G, and B colors are equal in film thickness to one another, and (ii) the light of each of the R, G, and B colors emitted externally after passing through the color filter of the corresponding color exhibits a first local maximum of light-extraction efficiency.

One aspect of the present invention provides a method of manufacturing an organic EL panel, comprising: a first step of preparing a first electrode of each of R (red), G (green), and B (blue) colors that reflects incident light; a second step of disposing a functional layer of each of the R, G, and B colors on the first electrode of a corresponding color; a third step of disposing an organic light-emitting layer that emits light of each of the R, G, and B colors on the functional layer of a corresponding color; a fourth step of disposing a second electrode that transmits incident light therethrough on the respective organic light-emitting layers of the R, G, and B colors so as to face the respective first electrodes of the R, G, and B colors; and a fifth step of disposing a color filter of each of the R, G, and B colors so as to be opposite the organic light-emitting layer of a corresponding color with the second electrode being interposed therebetween, wherein in the second step, the functional layer is disposed, such that (i) the respective functional layers of the R and G colors are equal in film thickness to each other, and differ in film thickness from the functional layer of the B color, (ii) with respect to the light of the corresponding color before passing through the color filter of the corresponding color, the film thickness of each of the respective functional layers of the R and G colors corresponds to a first local maximum of light-extraction efficiency, and (iii) with respect to the light of the B color before passing through the color filter of the B color, the film thickness of the functional layer of the B color corresponds to a value of light-extraction efficiency that is smaller than a first local maximum of light-extraction efficiency and is larger than a second local maximum of light-extraction efficiency, where the first local maximum of light-extraction efficiency is larger than the second local maximum of light-extraction efficiency, and in the third step, the organic light-emitting layer is disposed, such that (i) the respective organic light-emitting layers of the R, G, and B colors differ in film thickness from one another such that the respective functional layers of the R and G colors are equal in film thickness to each other, and differ in film thickness from the functional layer of the B color, and (ii) the light of each of the R, G, and B colors emitted externally after passing through the color filter of the corresponding color exhibits a first local maximum of light-extraction efficiency.

In the present Description, the expressions "have the same film thickness", "equal in film thickness", and so on indicate not only a case where respective layers of the R, G, and B colors have the same measured value of film thickness, but also a case where the respective layers of the R, G, and B colors each have a different measured value of film thickness within a manufacturing error range of ±10%.

Furthermore, an organic EL panel according to one aspect of the present invention is an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a functional layer of each of the R, G, and B colors that is disposed between the first electrode of a corresponding color and the organic light-emitting layer of a corresponding color; a color filter of each of the R, G, and B colors that is disposed opposite the organic light-emitting layer of a corresponding color with the second electrode being interposed therebetween, wherein a first portion of light of each of the R, G, and B colors emitted from the organic light-emitting layer of a corresponding color travels through the functional layer of a corresponding color towards the first electrode of a corresponding color, strikes and is reflected by the first electrode of the corresponding color, and then is emitted externally after passing through the functional layer of the corresponding color, the organic light-emitting layer of the corresponding color, the second electrode, and the color filter of a corresponding color, a second portion of the light of each of the R, G, and B colors travels towards the second electrode instead of towards the first electrode of the corresponding color, and is emitted externally after passing through the second electrode and the color filter of the corresponding color, a film thickness of the organic light-emitting layer of the R color is adjusted, such that the functional layer of the R color has the same film thickness corresponding to a local maximum of light-extraction efficiency between the case where the color filter of the R color is used and the case where the color filter is not used, a film thickness of the organic light-emitting layer of the G color is adjusted, such that the functional layer of the G color has the same film thickness corresponding to a local maximum of light-extraction efficiency between the case where the color filter of the G color is used and the case where the color filter is not used, a film thickness of the organic light-emitting layer of the B color is adjusted, such that (i) the functional layer of the B color has a different film thickness corresponding to a local maximum of light-extraction efficiency between the case where the color filter of the B color is used and the case where the color filter is not used and (ii) a higher light-extraction efficiency is exhibited in the case where the color filter is used than in the case where the color filter is not used, compared with the case where the same light-extraction efficiency is exhibited between the case where the color filter is used and the case where no color filter is used, and the respective functional layers of the R, G, and B colors each have the film thickness corresponding to a local maximum of light-extraction efficiency of the corresponding color in the case where the color filter of the corresponding color is used.

According to the one aspect of the present invention, the film thickness of each of the respective functional layers of the R, G, and B colors is adjusted so as to correspond to a local maximum of light-extraction efficiency in the case where a color filter of a corresponding color is used. Since this adjustment is based on the assumption that "the color filter of the corresponding color is used", the adjustment is made in consideration of light-extraction efficiency after approximation of a current chromaticity to a target chromaticity. Furthermore, the film thickness of the functional layer is adjusted so as to correspond to a local maximum of light-extraction efficiency. Accordingly, it is possible to realize both the increase in light-extraction efficiency and the increase in color reproducibility. Moreover, with respect to light of the B color, the film thickness of the light-emitting layer is adjusted such that a higher light-extraction efficiency is exhibited in the case where the color filter is used than in the case where no color filter is used, compared with the case where the same light-extraction efficiency is exhibited between the case where the color filter is used and the case where no color filter is used. Accordingly, it is possible to further improve the light-extraction efficiency of the B color.

[Pixel Structure of Organic EL Panel]

FIG. 1 is a cross-sectional diagram schematically showing the pixel structure of an organic EL panel according to an embodiment of the present invention.

The organic EL panel has R, G, and B pixels arranged regularly in a matrix of rows and columns. Each pixel is formed by an organic EL element with use of an organic material.

The blue organic EL element includes a substrate 1, a reflective electrode 2, a transparent conductive layer 3, a hole injection layer 4, a hole transport layer 5, an organic light-emitting layer 6b, an electron transport layer 7, a transparent electrode 8, a thin-film passivation layer 9, a resin passivation layer 10, a substrate 11, and a CF 13b. Hereinafter, the transparent conductive layer 3, the hole injection layer 4, and the hole transport layer 5 that are provided between the reflective electrode 2 and the organic light-emitting layer 6b are also collectively referred to as "first functional layer". Furthermore, the electron transport layer 7 that is provided between the organic light-emitting layer 6b and the transparent electrode 8 is also referred to as "second functional layer".

The green organic EL element has the same structure as the blue organic EL element, except for an organic light-emitting layer 6g and a CF 13g. The red organic EL element also has the same structure as the blue organic EL element, except for an organic light-emitting layer 6r and a CF 13r. In this example, the substrate 1, the electron transport layer 7, the transparent electrode 8, the thin-film passivation layer 9, the resin passivation layer 10, and the substrate 11 are shared by the respective organic EL elements of the R, G, and B colors, whereas other layers are partitioned by banks 12 among the respective organic EL elements of the R, G, and B colors.

Figure 2:
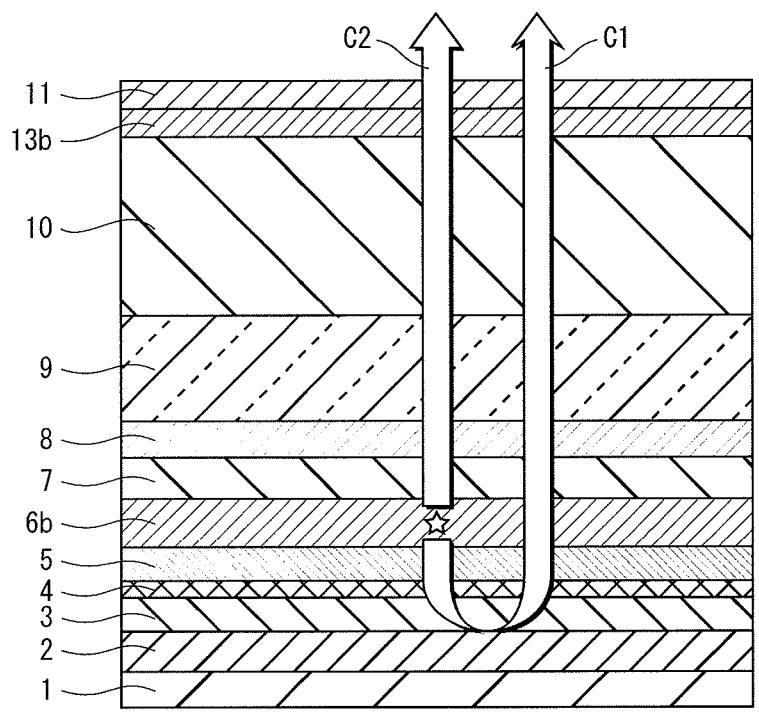
FIG. 2 shows an example of a cavity structure in a blue organic EL element.

In the organic EL element of each of the R, G, and B colors, a cavity structure is realized due to light interference phenomenon by providing the corresponding reflective electrode 2. FIG. 2 shows an example of a cavity structure in the blue organic EL element. Two optical paths are formed in the blue organic EL element. One is a first optical path C1, in which a portion of light emitted from the organic light-emitting layer 6b travels through the first functional layer towards the reflective electrode 2, strikes and is reflected by the reflective electrode 2, and then is emitted externally after passing through the first functional layer, the organic light-emitting layer 6b, the second functional layer, and the transparent electrode 8. The other is a second optical path C2, in which a remaining portion of the light emitted from the organic light-emitting layer 6b travels through the second functional layer towards the transparent electrode 8 instead of towards the reflective electrode 2, and then is emitted externally after passing through the transparent electrode 8. By appropriately setting the film thickness of the first functional layer, it is possible to cause light traveling the first optical path C1 and light traveling the second optical path C2 to strengthen each other, thereby increasing light-extraction efficiency.

In the case where no CF is used, when the film thickness of the first functional layer is varied without varying the film thickness of the organic light-emitting layer, light-extraction efficiency cyclically varies and a local maximum of light-extraction efficiency cyclically appears. The film thickness of the first functional layer corresponding to a local maximum of light-extraction efficiency is shifted by adjusting the film thickness of the organic light-emitting layer. Hereinafter, when a film thickness corresponding to a local maximum of light-extraction efficiency is referred to as "peak film thickness", a film thickness between each two peak film thicknesses is hereinafter referred to as "interval film thickness".

In the embodiment, the respective first functional layers of the R, G, and B colors have the same film thickness. Also, the respective organic light-emitting layers of the R, G, and B colors are each adjusted such that the respective first functional layers of the R, G, and B colors have the same film thickness under conditions 1 and 2 shown below. As a result, the respective organic light-emitting layers of the R, G, and B colors each have a different film thickness.

(Condition 1): The film thickness of each of the respective first functional layers of the R and G colors corresponds to the first local maximum of light-extraction efficiency of a corresponding color both in the case where the CFs are used and the case where no CF is used.

(Condition 2): The film thickness of the first functional layer of the B color is an interval film thickness in the case where no CF is used, and corresponds to the first local maximum in the case where the CF is used.

For simplification of the description, a film thickness that is thinner than a film thickness corresponding to the first local maximum is hereinafter referred to as a film thickness corresponding to the "0.5th" local maximum. Also, a film thickness that is thicker than the film thickness corresponding to the first local maximum and is thinner than a film thickness corresponding to the second local maximum is referred to as a film thickness corresponding to the "1.5th" local maximum. Similarly, a film thickness that is thicker than the film thickness corresponding to the second local maximum and is thinner than a film thickness corresponding to the third local maximum is referred to as a film thickness corresponding to the "2.5th" local maximum. Accordingly, Condition 2 is restated as that in the case where no CF is used, the first functional layer of the B color has a film thickness that is an interval film thickness corresponding to the 0.5th local maximum, the 1.5th local maximum, the 2.5th local maximum, or the like, and in the case where the CF is used, the first functional layer of the B color has a film thickness corresponding to the first local maximum.

According to the embodiment as described above, the respective first functional layers of the R, G, and B colors are each adjusted so as to have a film thickness corresponding to a local maximum of light-extraction efficiency of the corresponding color in the case where the CF is used. This realizes both the increase in light-extraction efficiency and the increase in color reproducibility.

From viewpoint of the increase in light-extraction efficiency and the simplification of manufacturing process, it is more preferable to adjust the respective first functional layers of the R, G, and B colors so as to have a film thickness corresponding to the first local maximum, the first local maximum, and the 0.5th local maximum, respectively, or the first local maximum, the first local maximum, and the 1.5th local maximum, respectively. The following details this.

[First Simulations]

The present inventors prepared Example 1 and Comparative example 1, and calculated an optimal film thickness of each layer constituting an organic EL element in Example 1 and Comparative example 1 through simulations.

Figure 3:
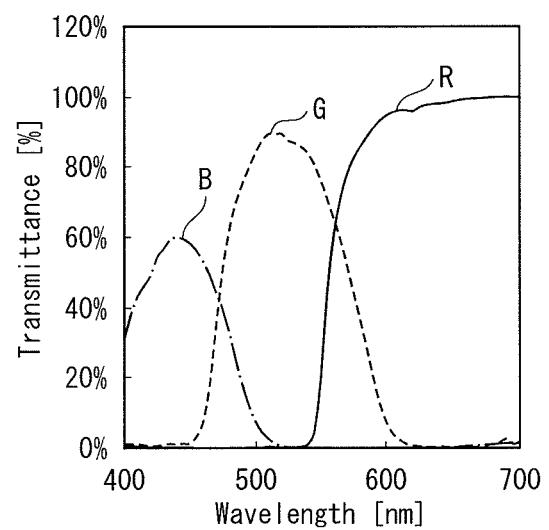
FIG. 3 shows the transmission spectrum of each of respective color filters (CFs) of the R, G, and B colors used in simulations.

In the first simulations, a reflective electrode is formed from an alloy of Ag, a transparent conductive layer is formed from ITO (Indium Tin Oxide), and respective organic light-emitting layers of the R, G, and B colors are formed from RP158, GP1200, and BP105 manufactured by Sumation Co., Ltd., respectively. FIG. 3 shows the transmission spectrum of each of respective CFs of the R, G, and B colors used in the first simulations. The present inventors created the CF characteristics used in the first simulations, by making appropriate adjustments based on a known art in view of the optical characteristics in the present embodiment. For example, the respective CF characteristics for the R and G colors are based on Japanese Patent Application Publication 2005-116516 (FIG. 5), and the CF characteristics for the B color are based on B440 by Opto-Line, Inc.

Figure 4A:
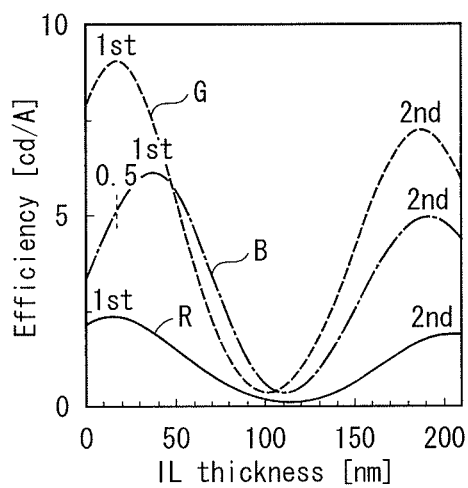
FIG. 4A to FIG. 4D show variation of light-extraction efficiency when varying the film thickness of a hole transport layer.
Figure 4C:
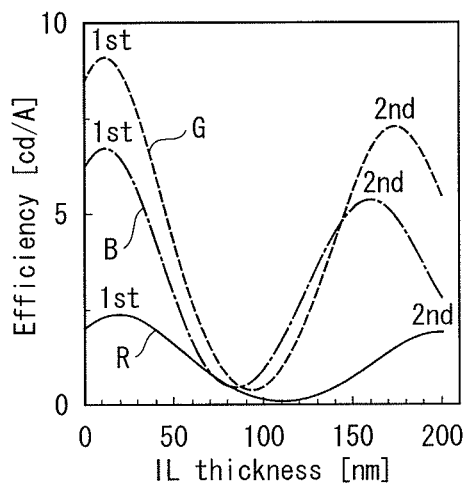
Figure 4B:
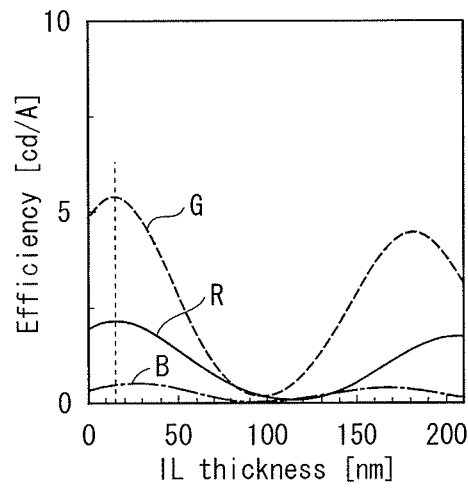
Figure 4D:
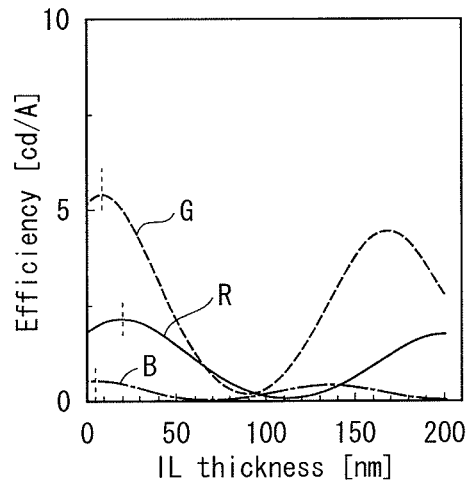

FIG. 4A to FIG. 4D show variation of light-extraction efficiency when varying the film thickness of the hole transport layer, FIG. 4A shows a case where no CF is used in Example 1, FIG. 4B shows a case where CFs are used in Example 1, FIG. 4C shows a case where no CF is used in Comparative example 1, and FIG. 4D shows a case where CFs are used in Comparative example 1.

In Example 1, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 15 nm. Respective organic light-emitting layers of the R, G, and B colors have a fixed film thickness of 90 nm, a fixed film thickness of 70 nm, and a fixed film thickness of 40 nm, respectively. The film thickness of only the hole transport layer is varied.

In Comparative example 1, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 15 nm. Respective organic light-emitting layers of the R, G, and B colors have a fixed film thickness of 80 nm, a fixed film thickness of 80 nm, and a fixed film thickness of 60 nm, respectively. The film thickness of only the hole transport layer is varied.

In the case where the CF is used, the following calculations are made with respect to all the film thicknesses that are simulation targets to calculate an optimal film thickness. An arbitrary film thickness is selected, and a chromaticity corresponding to the arbitrary film thickness in the case where no CF is used is calculated. CF characteristics for approximating the calculated chromaticity to a target chromaticity are calculated. Then, light-extraction efficiency in the case where a CF having the calculated CF characteristics is calculated.

FIG. 4A and FIG. 4C demonstrate the following points (1) to (3).

Point (1): Variation of the film thickness of the hole transport layer causes cyclic variation of the light-extraction efficiency. As a result, a local maximum of light-extraction efficiency cyclically appears.

Point (2): The cycle in which a local maximum appears shortens in the order of the R, G, and B colors. That is, the cycle in which a local maximum appears shortens as wavelength of light shortens.

Point (3): When a local maximum that cyclically appears is referred to as the first local maximum, the second local maximum, . . . , in order of increasing film thickness of the hole transport layer, a local maximum with a smaller degree has a larger value.

The points (1) and (2) indicate that interference occurs between light traveling the first optical path C1 and light traveling the second optical path C2. Also, the point (3) indicates that the light-extraction efficiency is increased more by setting the film thickness of the hole transport layer so as to correspond to a local maximum with a smaller degree.

Also as shown in FIG. 4A and FIG. 4B, in the case where no CF is used, when the respective hole transport layers of the R and G colors each have a film thickness of 15 nm, the first local maximum of light-extraction efficiency of a corresponding color appears. Also, in the case where the CF is used, when the respective hole transport layers of the R and G colors each have a film thickness of 15 mm, a local maximum of light-extraction efficiency appears. In other words, the respective hole transport layers of the R and G colors each have the same film thickness corresponding to a local maximum of light-extraction efficiency between the case where the CF is used and the case where no CF is used. Compared with this, in the case where no CF is used, when the hole transport layer of the B color has a film thickness of 40 nm, the first local maximum of light-extraction efficiency appears. Also, in the case where the CF is used, when the hole transport layer of the B color has a film thickness of 15 nm, a local maximum of light-extraction efficiency appears. In other words, the hole transport layer of the B color has a different film thickness corresponding to a local maximum of light-extraction efficiency between the case where the CF is used and the case where no CF is used.

Also according to FIG. 4B, in order to increase the light-extraction efficiency in Example 1, it is optimal for the respective hole transport layers of the R, G, and B colors to each have a film thickness of 15 nm. According to FIG. 4D compared with Example 1, in order to increase the light-extraction efficiency in Comparative example 1, it is optimal for the respective hole transport layers of the R, G, and B colors to have a film thickness of 20 nm, a film thickness of 9 nm, and a film thickness of 5 nm, respectively. In this way, in terms of optimal film thickness for increasing the light-extraction efficiency, while the respective hole transport layers of the R, G, and B colors are equal to one another in Example 1, the respective hole transport layers of the R, G, and B colors differ from one another in Comparative example 1. The difference between Example 1 and Comparative example 1 results from the film thickness adjustment on the organic light-emitting layer. Actually, in Example 1, the film thickness of the organic light-emitting layer for each of the R, G, and B colors is set such that the respective hole transport layers of the R, G, and B colors have the same film thickness corresponding to a local maximum of light-extraction efficiency of a corresponding color in the case where CFs are used. Specifically, the respective organic light-emitting layers of the R, G, and B colors have a film thickness of 90 nm, a film thickness of 70 nm, and a film thickness of 40 nm, respectively. In Comparative example 1 compared with Example 1, such a design concept was not introduced. The respective organic light-emitting layers of the R, G, and B colors are just set to have the same film thickness as much as possible, within a scope that does not affect light emission. Specifically, the respective organic light-emitting layers of the R, G, and B colors have a film thickness of 80 nm, a film thickness of 80 nm, and a film thickness of 60 nm, respectively. Due to the difference in design concept, there occurs a difference in results between Example 1 and Comparative example 1.

Note that, also in Comparative example 1, as shown in FIG. 4C, in the case where no CF is used, the respective hole transport layers of the R, G, and B colors have the same film thickness corresponding to the first local maximum of light-extraction efficiency of a corresponding color. However, as shown in FIG. 4D, in the case where CFs are used, the respective hole transport layers of the R, G, and B colors each have a different film thickness corresponding to the first local maximum of light-extraction efficiency. This suggests that in the case where each layer constituting the first functional layer is designed so as to have an optimal film thickness on the assumptions that no CF is used, the use of CFs does not necessarily make each designed layer to have an optimal film thickness. In other words, in the case where the use of CFs is assumed, the film thickness of each layer needs to be considered in view of the CF characteristics. In Example 1, the results are obtained after consideration of the film thickness of each layer in view of the CF characteristics, and an optimal design is made for the case where CFs are used.

In Example 1, the respective hole transport layers of the R, G, and B colors have the same film thickness. Furthermore, the respective first functional layers of the R, G, and B colors have the same film thickness. Also, the respective organic light-emitting layers of the R, G, and B colors each have a different film thickness. As shown below, it is often the case where the light-extraction efficiency is increased more by making film thickness adjustment on the organic light-emitting layer for each of the R, G, and B colors than by making film thickness adjustment on the first functional layer.

Figure 5A:
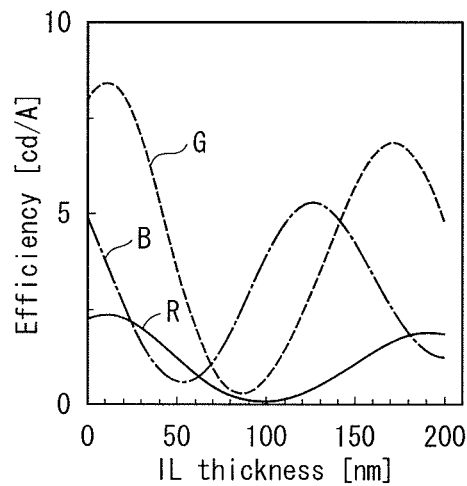
FIG. 5A to FIG. 5D each show variation of light-extraction efficiency when varying the film thickness of a layer constituting an organic EL element.
Figure 5C:
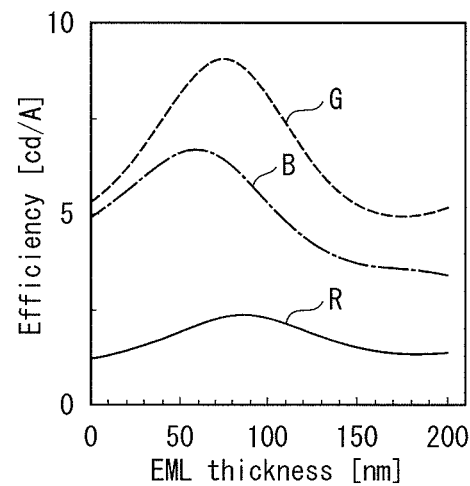
Figure 5B:
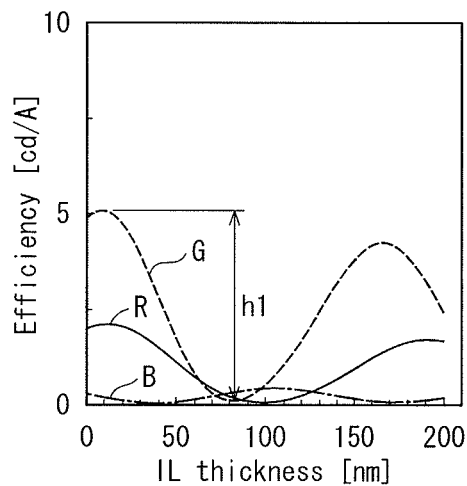
Figure 5D:
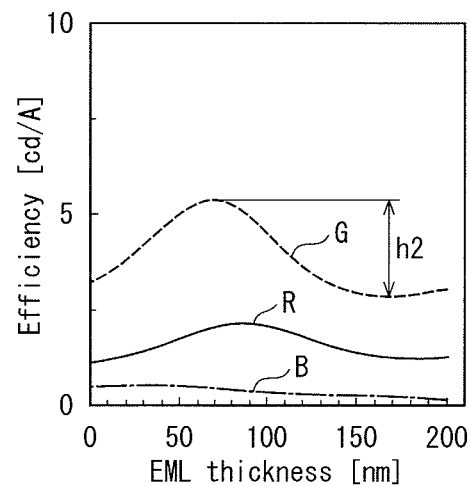

FIG. 5A to FIG. 5D each show variation of light-extraction efficiency when varying the film thickness of a layer constituting an organic EL element. Specifically, FIG. 5A and FIG. 5B show variation of light-extraction efficiency when varying the film thickness of the hole transport layer, in the case where no CF is used and the case where CFs are used, respectively. FIG. 5C and FIG. 5D show variation of light-extraction efficiency when varying the film thickness of the organic light-emitting layer, in the case where no CF is used and the case where CFs are used, respectively.

Comparison of FIG. 5B and FIG. 5D shows that the hole transport layer and the organic light-emitting layer are substantially equal in cycle of variation of light-extraction efficiency corresponding to the film thickness, and differ in variation width of the light-extraction efficiency, specifically, have a variation width h1 and a variation width h2, respectively. In other words, the organic light-emitting layer is smaller in ratio of variation of light-extraction efficiency to variation of film thickness than the hole transport layer.

In the case where the inkjet method is used for forming each layer constituting the organic EL element, the film thickness of the layer is adjusted by adjusting the number of drops of ink. Since the amount of one drop of ink is the minimum unit for adjustment of film thickness, the film thickness adjustment needs to be made not continuously but discretely. In this case, film thickness adjustment should be made on a layer having a smaller ratio of variation of light-extraction efficiency to variation of film thickness. This is advantageous for exact adjustment on the layer so as to have a film thickness corresponding to the highest light-extraction efficiency.

In Example 1, film thickness adjustment for each of the R, G, and B colors is made on the organic light-emitting layer. This makes it easy to exactly adjust the layer so as to have a film thickness corresponding to the highest light-extraction efficiency.

FIG. 6A and FIG. 6B show light-extraction efficiency and so on when the hole transport layer is set to have an optimal film thickness in Example 1 and Comparative example 1, respectively.

In Example 1 as described above, the respective hole transport layers of the R, G, and B colors each have an optimal film thickness of 15 nm. Here, the respective organic EL elements of the R, G, and B colors exhibit a light-extraction efficiency of 2.1 cd/A, a light-extraction efficiency of 5.0 cd/A, and a light-extraction efficiency of 0.57 cd/A, respectively. Also, the respective organic EL elements of the R, G, and B colors exhibit a chromaticity of (0.66, 0.34), a chromaticity of (0.28, 0.68), and a chromaticity (0.13, 0.06), respectively. Furthermore, respective tolerable limits of difference in film thickness of the respective first functional layers of the R, G, and B colors are a range of −10 nm to +10 nm, a range of −9 nm to +11 nm, and a range of −15 nm to +10 nm, respectively. Tolerable margin widths of the respective first functional layers of the R, G, and B colors are 20 nm, 20 nm, and 25 nm, respectively.

The "tolerable limits of difference in film thickness" indicate the tolerable limits of difference in film thickness of each layer from the optimal value under the conditions that allowable ranges shown in FIG. 7 are satisfied. FIG. 7 shows the following allowable ranges of:

(1) 20% or lower variation of light-extraction efficiency at a surface of the organic EL panel;

(2) variation of chromaticity of x of 0.04 or less and y of 0.04 or less at the surface of the organic EL panel;

(3) a brightness of 90% or higher at a viewing angle of 30° with respect to a brightness at a viewing angle of 0° and a brightness of 80% or higher at a viewing angle of 45° with respect to a brightness at a viewing angle of 0°; and (4) difference in chromaticity of x of 0.04 or less and y of 0.04 or less between a viewing angle of 50° and a viewing angle of 0°.

Broader tolerable limits of difference in film thickness make it easier to adjust the film thickness on each layer during the manufacturing process. The "tolerable margin width" indicates a difference between the upper limit and the lower limit in the tolerable limits of difference in film thickness (for example, each layer of the R color in Example 1 has a tolerable margin width of 20 which is the difference between the upper limit of +10 and the lower limit of −10).

In Comparative example 1, the respective hole transport layers of the R, G, and B colors have an optimal film thickness of 20 nm, an optimal film thickness of 9 nm, and an optimal film thickness of 5 nm, respectively. Here, the respective organic EL elements of the R, G, and B colors exhibit a light-extraction efficiency of 2.1 cd/A, a light-extraction efficiency of 5.0 cd/A, and a light-extraction efficiency of 0.51 cd/A, respectively. Also, the respective organic EL elements of the R, G, and B colors exhibit a chromaticity of (0.66, 0.34), a chromaticity of (0.28, 0.68), and a chromaticity (0.13, 0.06), respectively. Furthermore, respective tolerable limits of difference in film thickness of the first functional layers of the R, G, and B colors are a range of −11 nm to +9 nm, a range of −7 nm to +11 nm, and a range of −7 nm to +11 nm, respectively. Tolerable margin widths of the first functional layers of the R, G, and B colors are 20 nm, 18 nm, and 18 nm, respectively.

According to Example 1 as described above, it is possible to ensure the chromaticity that is at the same level as that in Comparative example 1, and to increase especially the light-extraction efficiency of the B color than in Comparative example 1. Furthermore, it is possible to set the respective first functional layers of the R, G, and B colors to have the same film thickness, thereby simplifying the manufacturing process.

In Example 1, the organic light-emitting layer of the B color is set to have a film thickness of 40 nm. This causes a difference in film thickness of the hole transport layer corresponding to a local maximum of light-extraction efficiency between the case where the CF is used and the case where no CF is used. It is proved that in the case where the organic light-emitting layer of the B color is set to have a film thickness of 55 nm, the hole transport layer has the same film thickness corresponding to a local maximum of light-extraction efficiency between the case where the CF is used and the case where no CF is used. Here, the light-extraction efficiency of the B color is 0.51 cd/A. As a result of comparison between the case where the film thickness of the organic light-emitting layer of the B color is 40 nm and the case where the film thickness of the organic light-emitting layer of the B color is 55 nm, the following is derived. It is possible to increase the light-extraction efficiency more by adjusting the film thickness of the transport layer of the B color so as to differ in corresponding local maximum of light-extraction efficiency between the case where the CF is used and the case where no CF is used than by adjusting the film thickness of the hole transport layer of the B color so as to be equal in corresponding local maximum of light-extraction efficiency between the case where the CF is used and the case where no CF is used.

Therefore, from viewpoint of the increase in light-extraction efficiency and the simplification of manufacturing process, it is preferable to adjust the respective first functional layers of the R, G, and B colors so as to have film thicknesses corresponding to the first local maximum of light-extraction efficiency, the first local maximum of light-extraction efficiency, and the 0.5th local maximum of light-extraction efficiency, respectively.

Also, each layer constituting the organic EL element should have a film thickness within a range of ±10% of a film thickness obtained through the simulations in view of manufacturing errors. FIG. 8A to FIG. 8C each show the minimum value, the average value, and the maximum value of the film thickness of each layer constituting the organic EL element in Example 1, with respect to the R, G, and B colors, respectively. Specifically, the respective transparent conductive layers of the R, G, and B colors each should have a film thickness of 13.5 nm to 16.5 nm. The respective hole injection layers of the R, G, and B colors each should have a film thickness of 4.5 nm to 5.5 nm. The respective hole transport layers of the R, G, and B colors each should have a film thickness of 13.5 nm to 16.5 nm. The respective electron transport layers of the R, G, and B colors each should have a film thickness of 27 nm to 33 nm. Here, the respective organic light-emitting layers of the R, G, and B colors each have an optical distance of 57.6 nm to 70.4 nm from the reflective electrode, and each have an optical distance of 48.6 nm to 59.4 nm from the transparent electrode. Also, the respective organic light-emitting layers of the R, G, and B colors should have a film thickness of 81 nm to 99 nm, a film thickness of 63 nm to 77 nm, and a film thickness of 36 nm to 44 nm, respectively.

[Second Simulations]

The present inventors further prepared Example 2 and Comparative example 2, and calculated an optimal film thickness of each layer constituting an organic EL element in Example 2 and Comparative example 2 through simulations. The second simulations differ from the first simulations in that a reflective electrode and a transparent conductive layer used in the second simulations are formed from an alloy of Al and IZO (Indium Zinc Oxide), respectively.

Figure 9A:
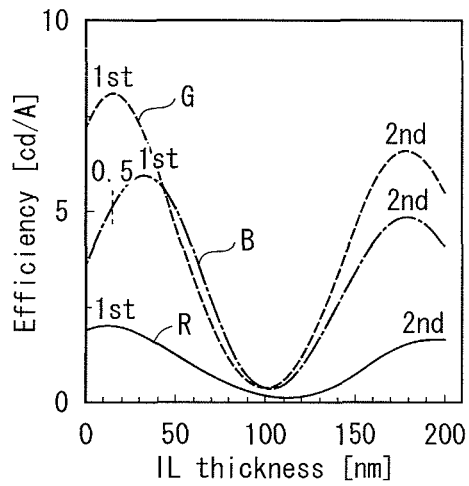
FIG. 9A to FIG. 9D show variation of light-extraction efficiency when varying the film thickness of a hole transport layer.
Figure 9C:
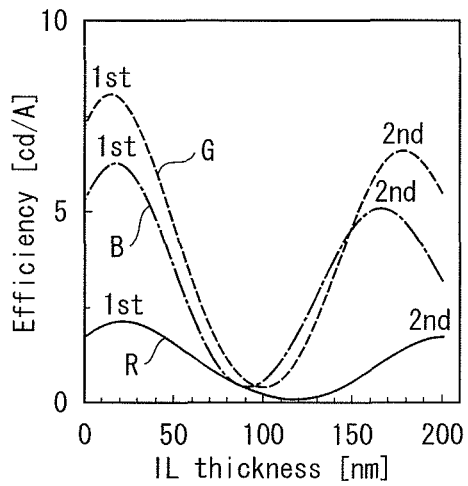
Figure 9B:
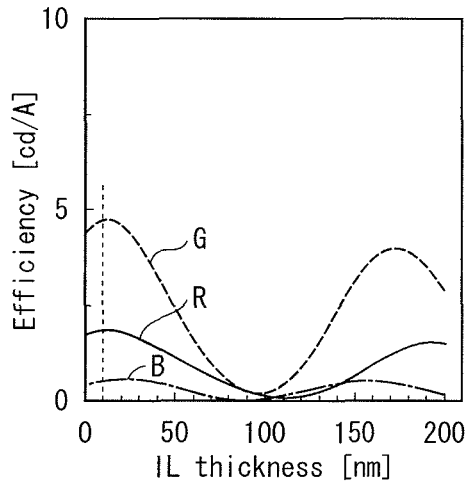
Figure 9D:
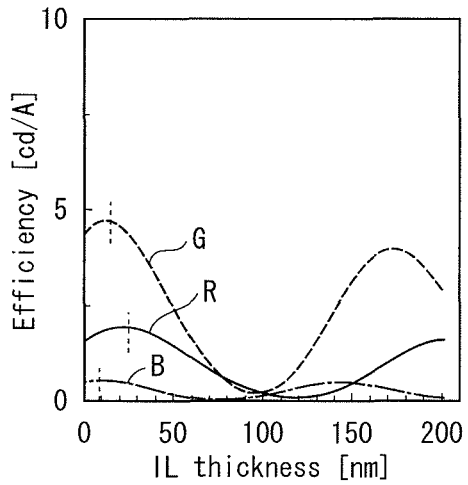

FIG. 9A to FIG. 9D show variation of light-extraction efficiency when varying the film thickness of the hole transport layer, FIG. 9A shows a case where no CF is used in Example 2, FIG. 9B shows a case where CFs are used in Example 2, FIG. 9C shows a case where no CF is used in Comparative example 2, and FIG. 9D shows a case where CFs are used in Comparative example 2.

In Example 2, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 20 nm. Respective organic light-emitting layers of the R, G, and B colors have a fixed film thickness of 90 nm, a fixed film thickness of 80 nm, and a fixed film thickness of 40 nm, respectively. The film thickness of only the hole transport layer is varied.

In Comparative example 2, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 20 nm. Respective organic light-emitting layers of the R, G, and B colors have a fixed film thickness of 80 nm, a fixed film thickness of 80 nm, and a fixed film thickness of 60 nm, respectively. The film thickness of only the hole transport layer is varied.

According to FIG. 9B, in order to increase the light-extraction efficiency in Example 2, it is optimal for the respective hole transport layers of the R, G, and B colors each to have a film thickness of 10 nm. According to FIG. 9D compared with Example 2, in order to increase the light-extraction efficiency in Comparative example 2, it is optimal for the respective hole transport layers of the R, G, and B colors to have a film thickness of 25 nm, a film thickness of 16 nm, and a film thickness of 9 nm, respectively. In this way, in terms of optimal film thickness for increasing the light-extraction efficiency, while the respective hole transport layers of the R, G, and B colors are equal to one another in Example 2, the respective hole transport layers of the R, G, and B colors differ from one another in Comparative example 2. The reason for this is as described in the first simulations. In Example 2, the respective organic light-emitting layers of the R, G, and B colors are set to have a film thickness of 90 nm, a film thickness of 80 nm, and a film thickness of 40 nm, respectively, such that the respective hole transport layers of the R, G, and B colors have the same film thickness corresponding to the first local maximum of light-extraction efficiency of a corresponding color in the case where CFs are used. In Comparative example 2 compared with Example 2, the respective organic light-emitting layers of the R, G, and B colors are set to have a film thickness of 80 nm, a film thickness of 80 nm, and a film thickness of 60 nm, respectively, in the same manner as in the first simulations.

FIG. 10A and FIG. 10B show light-extraction efficiency and so on when a hole transport layer is set to have an optimal film thickness in Example 2 and Comparative example 2, respectively.

In Example 2 as described above, the respective hole transport layers of the R, G, and B colors each have an optimal film thickness of 10 nm. Here, the respective organic EL elements of the R, G, and B colors exhibit a light-extraction efficiency of 1.8 cd/A, a light-extraction efficiency of 4.7 cd/A, and a light-extraction efficiency of 0.58 cd/A, respectively. Also, the respective organic EL elements of the R, G, and B colors exhibit a chromaticity of (0.66, 0.34), a chromaticity of (0.28, 0.67), and a chromaticity (0.13, 0.06), respectively. Furthermore, respective tolerable limits of difference in film thickness of the respective first functional layers of the R, G, and B colors are a range of −10 nm to +12 nm, a range of −10 nm to +17 nm, and a range of −6 nm to +9 nm, respectively. Tolerable margin widths of the respective first functional layers of the R, G, and B colors are 22 nm, 27 nm, and 15 nm, respectively.

In Comparative example 2, the respective hole transport layers of the R, G, and B colors have an optimal film thickness of 25 nm, an optimal film thickness of 16 nm, and an optimal film thickness of 9 nm, respectively. Here, the respective organic EL elements of the R, G, and B colors exhibit a light-extraction efficiency of 1.9 cd/A, a light-extraction efficiency of 4.7 cd/A, and a light-extraction efficiency of 0.49 cd/A, respectively. Also, the respective organic EL elements of the R, G, and B colors exhibit a chromaticity of (0.66, 0.34), a chromaticity of (0.28, 0.67), and a chromaticity (0.13, 0.06), respectively. Furthermore, respective tolerable limits of difference in film thickness of the respective first functional layers of the R, G, and B colors are a range of −13 nm to +13 nm, a range of −17 nm to +11 nm, and a range of −9 nm to +11 nm, respectively. Tolerable margin widths of the respective first functional layers of the R, G, and B colors are 26 nm, 28 nm, and 20 nm, respectively.

According to Example 2 as described above, it is possible to ensure the chromaticity that is at the same level as that in Comparative example 2, and to increase especially the light-extraction efficiency of the B color than in Comparative example 2. Furthermore, it is possible to set the respective first functional layers of the R, G, and B colors to have the same film thickness, thereby simplifying the manufacturing process.

Therefore, from viewpoint of the increase in light-extraction efficiency and the simplification of manufacturing process, it is preferable to adjust the respective first functional layers of the R, G, and B colors so as to have film thicknesses corresponding to the first local maximum, the first local maximum, and the 0.5th local maximum of light-extraction efficiency, respectively.

Also, each layer constituting the organic EL element should have a film thickness within a range of ±10% of a film thickness obtained through the simulations in view of manufacturing errors. FIG. 11A to FIG. 11C each show the minimum value, the average value, and the maximum value of the film thickness of each layer constituting the organic EL element in Example 2, with respect to the R, G, and B colors, respectively. Specifically, the respective transparent conductive layers of the R, G, and B colors each should have a film thickness of 18 nm to 22 nm. The respective hole injection layers of the R, G, and B colors each should have a film thickness of 4.5 nm to 5.5 nm. The respective hole transport layers of the R, G, and B colors each should have a film thickness of 9 nm to 11 nm. The respective electron transport layers of the R, G, and B colors each should have a film thickness of 27 nm to 33 nm. Here, the respective organic light-emitting layers of the R, G, and B colors each have an optical distance of 60.5 nm to 74.0 nm from the reflective electrode, and each have an optical distance of 48.6 nm to 59.4 nm from the transparent electrode. Also, the respective organic light-emitting layers of the R, G, and B colors should have a film thickness of 81 nm to 99 nm, a film thickness of 72 nm to 88 nm, and a film thickness of 36 nm to 44 nm, respectively.

[Third Simulations]

The present inventors further prepared Example 3 and Comparative example 3, and calculated an optimal film thickness of each layer constituting an organic EL element in Example 3 and Comparative example 3 through simulations. The third simulations differ from the first simulations in that a reflective electrode and a transparent conductive layer used in the third simulations are formed from an alloy of Al and IZO (Indium Zinc Oxide), respectively, and in that the respective first functional layers of the R, G, and B colors have film thicknesses corresponding to the first local maximum, the first local maximum, and the 1.5th local maximum of light-extraction efficiency, respectively.

Figure 12A:
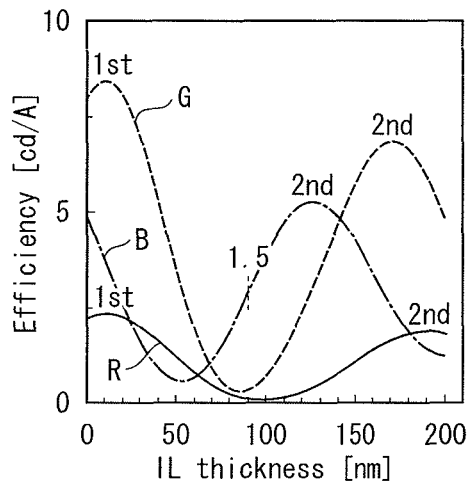
FIG. 12A to FIG. 12D show variation of light-extraction efficiency when varying the film thickness of a hole transport layer.
Figure 12C:
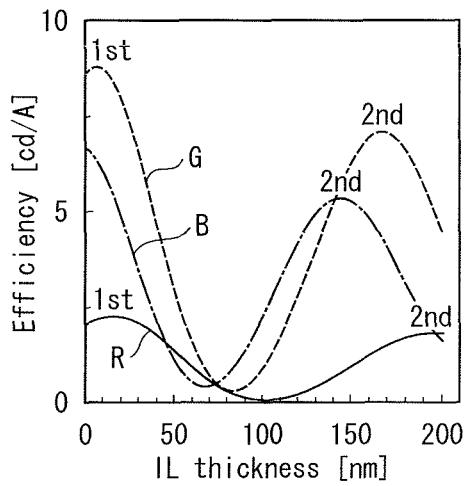
Figure 12B:
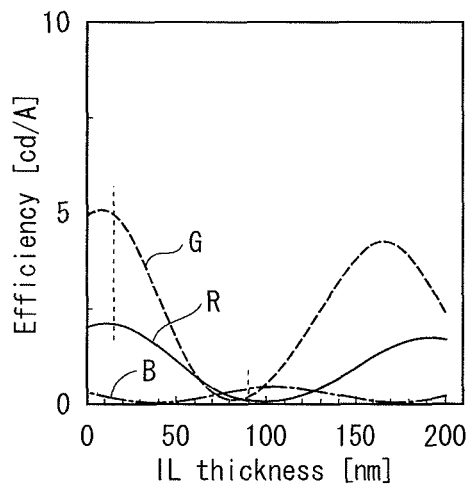
Figure 12D:
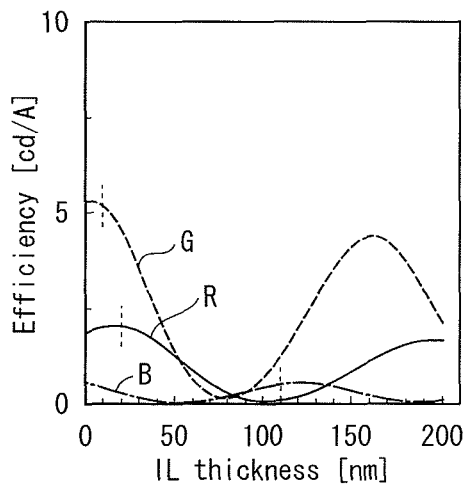

FIG. 12A to FIG. 12D show variation of light-extraction efficiency when varying the film thickness of the hole transport layer, FIG. 12D shows a case where no CF is used in Example 3, FIG. 12B shows a case where CFs are used in Example 3, FIG. 12C shows a case where no CF is used in Comparative example 3, and FIG. 12D shows a case where CFs are used in Comparative example 3.

In Example 3, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 30 nm. Respective organic light-emitting layers of the R, G, and B colors have a fixed film thickness of 60 nm, a fixed film thickness of 40 nm, and a fixed film thickness of 100 nm, respectively. The film thickness of only the hole transport layer is varied.

In Comparative example 3, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 30 nm. An organic light-emitting layer of each of the R, G, and B colors has a fixed film thickness of 50 nm. The film thickness of only the hole transport layer is varied.

According to FIG. 12B, in order to increase the light-extraction efficiency in Example 3, it is optimal for the respective hole transport layers of the R, G, and B colors to have a film thickness of 15 nm, a film thickness of 15 nm, and a film thickness of 90 nm, respectively. According to FIG. 12D compared with Example 3, in order to increase the light-extraction efficiency in Comparative example 3, it is optimal for the respective hole transport layers of the R, G, and B colors to have a film thickness of 20 nm, a film thickness of 10 nm, and a film thickness of 110 nm, respectively.

The hole transport layer can be formed by the inkjet method that is one type of printing methods. Compared with a vacuum vapor deposition method or a sputtering method that is one type of physical vapor deposition methods, the inkjet method facilitates film formation for each of the R, G, and B colors. By making film thickness adjustment for each of the R, G, and B colors on the hole transport layer, which can be formed by the inkjet method, as shown in Example 3, it is possible to simplify the manufacturing process. Also, the difference in film thickness of the hole transport layer among the R, G, and B colors is smaller in Example 3 than in Comparative example 3. As a result, the hole transport layer is further easily formed by the inkjet method, and this contributes to the simplification of the manufacturing process.

FIG. 13A and FIG. 13B show light-extraction efficiency and so on when the hole transport layer is set to have an optimal film thickness in Example 3 and Comparative example 3, respectively.

In Example 3 as described above, the respective hole transport layers of the R, G, and B colors have an optimal film thickness of 15 nm, an optimal film thickness of 15 nm, an optimal film thickness of 90 nm, respectively. Here, the respective organic EL elements of the R, G, and B colors exhibit a light-extraction efficiency of 2.1 cd/A, a light-extraction efficiency of 5.0 cd/A, and a light-extraction efficiency of 0.51 cd/A, respectively. Also, the respective organic EL elements of the R, G, and B colors exhibit a chromaticity of (0.66, 0.34), a chromaticity of (0.28, 0.68), and a chromaticity (0.13, 0.06), respectively.

In Comparative example 3, the respective hole transport layers of the R, G, and B colors have an optimal film thickness of 20 nm, an optimal film thickness of 10 nm, and an optimal film thickness of 110 nm, respectively. Here, the respective organic EL elements of the R, G, and B colors exhibit a light-extraction efficiency of 2.0 cd/A, a light-extraction efficiency of 5.2 cd/A, and a light-extraction efficiency of 0.51 cd/A, respectively. Also, the respective organic EL elements of the R, G, and B colors exhibit a chromaticity of (0.66, 0.34), a chromaticity of (0.28, 0.68), and a chromaticity (0.13, 0.06), respectively.

According to Example 3 as described above, it is possible to exhibit the light-extraction efficiency and the chromaticity that are at the same level as those in Comparative example 3, and also to reduce the difference in film thickness of the first functional layer among the R, G, and B colors. As a result, it is possible to realize both the increase in light-extraction efficiency and the simplification of the manufacturing process.

Also, each layer constituting the organic EL element should have a film thickness within a range of ±10% of a film thickness obtained through the simulations in view of manufacturing errors. FIG. 14A to FIG. 14C each show the minimum value, the average value, and the maximum value of the film thickness of each layer constituting the organic EL element in Example 3, with respect to the R, G, and B colors, respectively. Specifically, the respective transparent conductive layers of the R, G, and B colors each should have a film thickness of 27 nm to 33 nm. The respective hole injection layers of the R, G, and B colors each should have a film thickness of 4.5 nm to 5.5 nm. The respective electron transport layers of the R, G, and B colors each should have a film thickness of 27 nm to 33 nm. Also, the respective hole transport layers of the R and G colors each should have a film thickness of 13.5 nm to 16.5 nm, and the hole transport layer of the B color should have a film thickness of 81 nm to 99 nm. Here, the respective organic light-emitting layers of the R and G colors each have an optical distance of 86.4 nm to 105.6 nm from the reflective electrode, and the organic light-emitting layer of the B color has an optical distance of 202.8 nm to 247.9 nm from the reflective electrode. The organic light-emitting layer each of the R, G, and B colors has an optical distance of 48.6 nm to 59.4 nm from the transparent electrode. Furthermore, the respective organic light-emitting layers of the R, G, and B colors should have a film thickness of 54 nm to 66 nm, a film thickness of 36 nm to 44 nm, and a film thickness of 90 nm to 110 nm, respectively.

[Supplementary Description]

The description has been already given on that in the case where CFs are used, the film thickness of each layer needs to be considered in view of the CF characteristics. The following describes this in more detail.

Figure 15A:
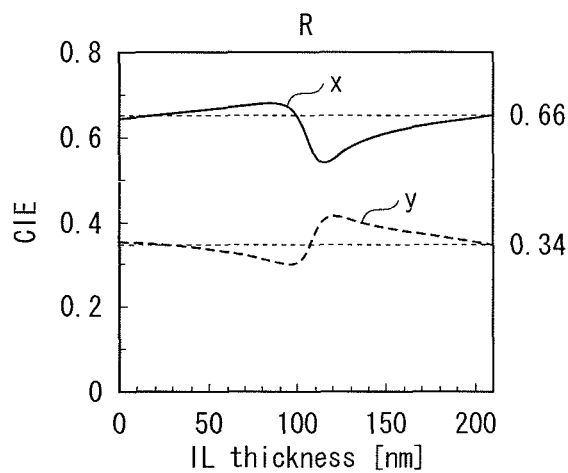
FIG. 15A to FIG. 15C show variation of chromaticity (x,y) when varying the film thickness of respective hole transport layers of the R, G, and B colors, respectively, in Example 3.
Figure 15B:
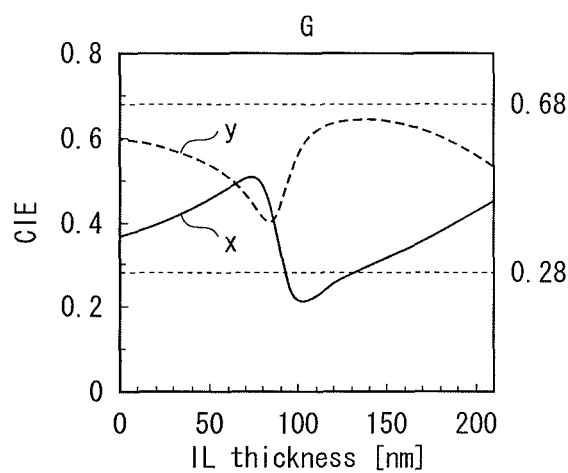
Figure 15C:
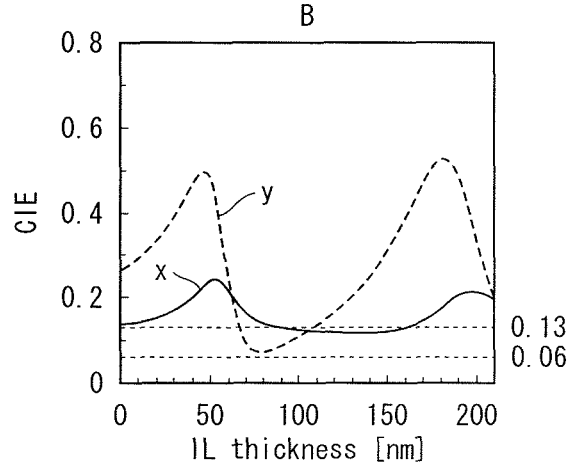

FIG. 15A to FIG. 15C show variation of chromaticity (x,y) when varying the film thickness of the respective hole transport layers of the R, G, and B colors, respectively, in Example 3.

FIG. 15A to FIG. 15D prove that when the film thickness of the hole transport layer is varied, the chromaticity varies. Furthermore, FIG. 15A to FIG. 15D and FIG. 12A prove that a chromaticity corresponding to a local maximum of light-extraction efficiency is not necessarily at the neighborhood of a target chromaticity. Here, the respective target chromaticities of the R, G, and B colors are (0.66, 0.34), (0.28, 0.68), and (0.13, 0.06), respectively. For example, when the hole transport layer of the B color has a film thickness of 125 nm, the second local maximum of light-extraction efficiency appears (FIG. 12A). At this time, the chromaticity of the B color has a y value at the neighborhood of 0.20 (FIG. 15C) that is away from a target chromaticity having a y value of 0.06.

The more greatly a current chromaticity differs from the target chromaticity in the case where no CF is used, the more chromaticity correction needs to be made with use of CFs. As a result, there is a case where though a chromaticity before chromaticity correction with use of no CF corresponds to a local maximum of light-extraction efficiency, a chromaticity after the chromaticity correction with use of CFs does not correspond to a local maximum of light-extraction efficiency.

Therefore, in the case where CFs are used, the film thickness of each layer needs to be considered in view of the CF characteristics.

Also, the following is derived with use of a general method of analyzing the cavity structure. In the cavity structure, the following Equation 1 is satisfied by an optical distance L in nm between the reflective electrode and the organic light-emitting layer, a cavity wavelength λ, in nm, and a phase shift Φ in radians.

$$\frac{2L}{\lambda} + \frac{\Phi}{2\pi} = m \quad \text{[Equation 1]}$$

The phase shift Φ in the reflective electrode is calculated from the following Equation 2.

$$\Phi = \tan^{-1}\left(\frac{2n_1 k_o}{n_1^2 - n_0^2 - k_0^2}\right) \quad \text{[Equation 2]}$$

Here, $n_1$ represents a refractive index of the transparent conductive layer, $n_0$ represents a refractive index of the reflective electrode, and $k_0$ represents an extinction coefficient of the reflective electrode.

FIG. 16 demonstrates, in Example 3, the right member m in Equation 1 is an integer of zero with respect to each of the R and G colors, and is a decimal number of 0.5 with respect to the B color.

[Specific Examples of Each Layer]

<Substrate>

The substrate 1 is a Thin Film Transistor (TFT) substrate, for example. The substrate 1 is a glass plate or quartz plate of soda glass, nonfluorescent glass, phosphate glass, borate glass, or the like; a plastic plate or plastic film of acrylic resin, styrenic resin, polycarbonate resin, epoxy resin, polyethylene, polyester, silicone resin, or the like; or a metal plate or metal foil of alumina or the like.

<Banks>

The banks 12 should be formed from an insulating material, and it is preferable that the banks 12 have organic solvent resistance. Furthermore, since the banks 12 undergo etching, baking, and the like, it is preferable that the banks 12 be formed from a material that is highly resistant to such processes. The material for the banks 12 may be an organic material such as resin, or an inorganic material such as glass. As an organic material, acrylic resin, polyimide resin, novolac-type phenolic resin, and the like can be used. As an inorganic material, silicon dioxide ($SiO_2$), silicon nitride ($Si_3N_4$), and the like can be used.

<Reflective Electrode>

The reflective electrode 2 is electrically connected to the TFT provided on the substrate 1. In addition to functioning as a positive terminal of the organic EL element, the reflective electrode 2 has the function of reflecting light emitted from the organic light-emitting layers 6b, 6g, and 6r towards the reflective electrode 2. The reflecting function may be achieved by the structural material of the reflective electrode 2 or by applying a reflective coating to the surface portion of the reflective electrode 2. For example, the reflective electrode 2 is formed from Ag (silver), APC (alloy of silver, palladium, and copper), ARA (alloy of silver, rubidium, and gold), MoCr (alloy of molybdenum and chromium), NiCr (alloy of nickel and chromium), or the like.

<Transparent Conductive Layer>

The transparent conductive layer 3 functions as a protective layer to prevent the reflective electrode 2 from naturally oxidizing during the manufacturing process. The material for the transparent conductive layer 3 should be formed from a conductive material sufficiently translucent with respect to light emitted by the organic light-emitting layers 6b, 6g, and 6r. For example, the transparent conductive layer 3 is preferably formed from ITO or IZO, which achieve good conductivity even when a film thereof is formed at room temperature.

<Hole Injection Layer>

The hole injection layer 4 has the function of injecting holes into the organic light-emitting layers 6b, 6g, and 6r. The hole injection layer 4 is formed from an oxide of a transition metal, such as tungsten oxide (WOx), molybdenum oxide (MoOx), and molybdenum tungsten oxide (MoxWyOz). Forming the hole injection layer 4 from an oxide of a transition metal allows for improvement of voltage-current density characteristics, and for an increase in emission intensity by increasing current density. Note that other metal compounds, such as a transition metal nitride, may also be used.

<Hole Transport Layer>

Examples of the material for the hole transport layer 5 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are preferable.

<Organic Light-Emitting Layer>

The organic light-emitting layers 6b, 6g, and 6r are formed from a fluorescent material such as, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, and the like, as recited in Japanese Patent Application Publication No. H5-163488.

<Electron Transport Layer>

Examples of the material for the electron transport layer 7 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

Note that from the perspective of further improving electron injection characteristics, the above materials for forming the electron transport layer may be doped with an alkali metal or an alkaline-earth metal, such as Na, Ba, or Ca.

<Transparent Electrode>

The transparent electrode 8 functions as a negative electrode for the organic EL element. The material for the transparent electrode 8 should be formed from a conductive material sufficiently translucent with respect to light emitted by the organic light-emitting layers 6b, 6g, and 6r. For example, the transparent electrode 8 is preferably formed from ITO or IZO.

<Thin-Film Passivation Layer>

The thin-film passivation layer 9 has the function of preventing the layers interposed between the substrate 1 and the thin-film passivation layer 9 from being exposed to moisture or air. The material for the thin-film passivation layer 9 is, for example, silicon nitride (SiN), silicon oxynitride (SiON), resin, or the like.

<Resin Passivation Layer>

The resin passivation layer 10 has the functions of adhering a back panel, which is composed of the layers from the substrate 1 to the thin-film passivation layer 9, to the substrate 11, on which are formed the color filters 13b, 13g, and 13r, and of preventing the layers from being exposed to moisture or air. The material for the resin passivation layer 10 is, for example, a resin adhesive or the like.

<Color Filters>

The color filters 13b, 13g, and 13r have the function of correcting the chromaticity of light emitted by the organic light-emitting layers.

[Organic Display Device]

Figure 17:
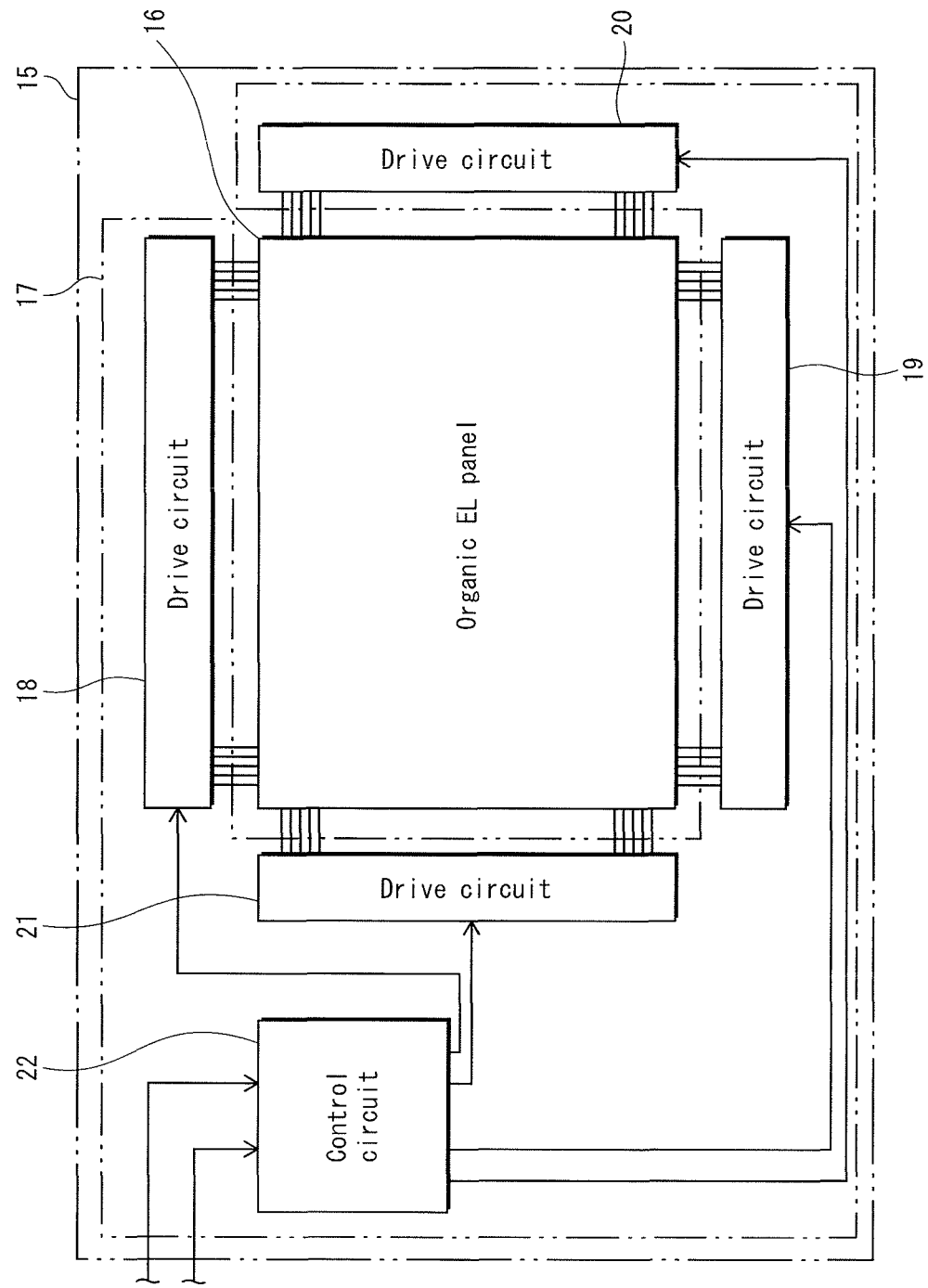
FIG. 17 is a functional block showing an organic display device according to the embodiment of the present invention.
Figure 18:
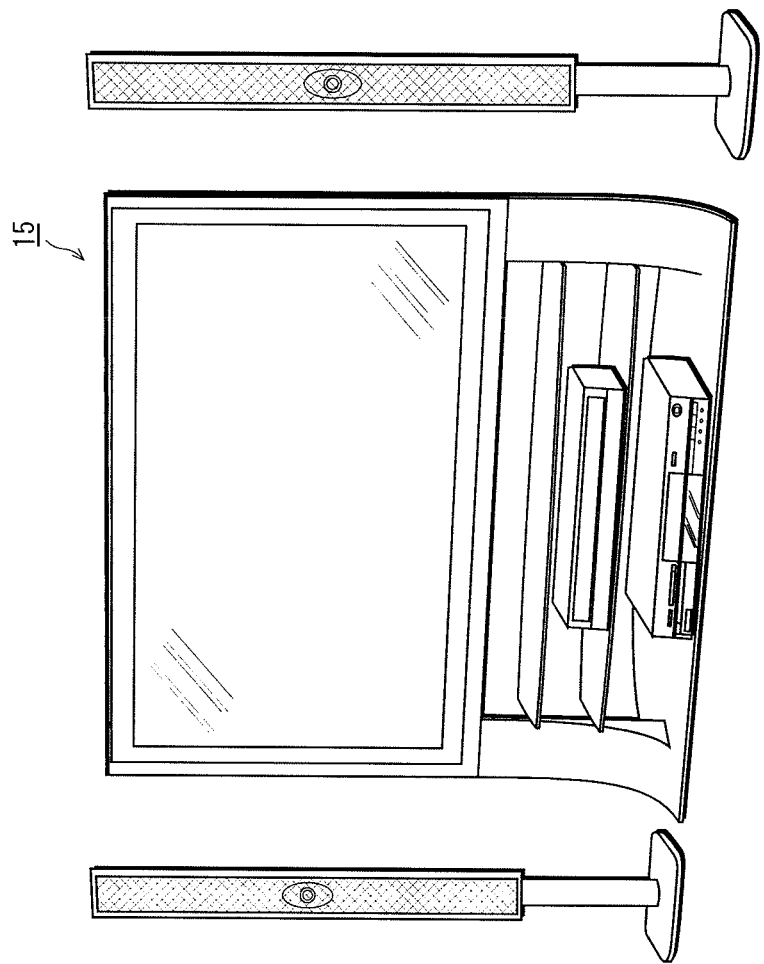
FIG. 18 is an exemplary external diagram showing the organic display device according to the embodiment of the present invention.

FIG. 17 is a functional block showing an organic display device according to the embodiment of the present invention. FIG. 18 is an exemplary external diagram showing the organic display device according to the embodiment of the present invention. An organic display device 15 includes an organic display panel 16 and a drive control unit 17 that are electrically connected to each other. The organic display panel 16 has the pixel structure shown in FIG. 1. The drive control unit 17 includes drive circuits 18 to 21 that apply voltage between the reflective electrode 2 corresponding to each organic EL element and a transparent electrode 8, and a control circuit 22 that controls operations of the drive circuits 18 to 21.

[Method of Manufacturing Organic EL Panel]

Next, the method of manufacturing an organic EL panel is described. FIG. 19A to FIG. 19D and FIG. 20A to FIG. 20C how a method of manufacturing an organic EL panel according to the embodiment of the present invention.

Figure 19A:
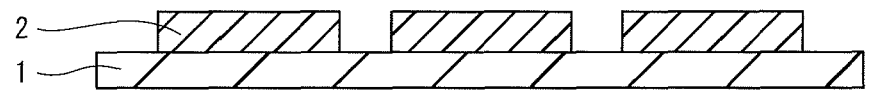
FIG. 19A to FIG. 19D show a method of manufacturing the organic EL panel according to the embodiment of the present invention.
Figure 19B:
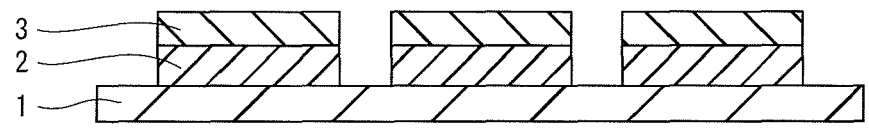

First, reflective electrodes 2 are formed on a substrate 1 by a vapor deposition method, a sputtering method, or the like (FIG. 19A). Next, transparent conductive layers 3 are formed on the respective reflective electrodes 2 by the vapor deposition method, the sputtering method, or the like (FIG. 19B). The respective transparent conductive layers 3 of the R, G, and B colors are set to have the same film thickness.

Figure 19C:
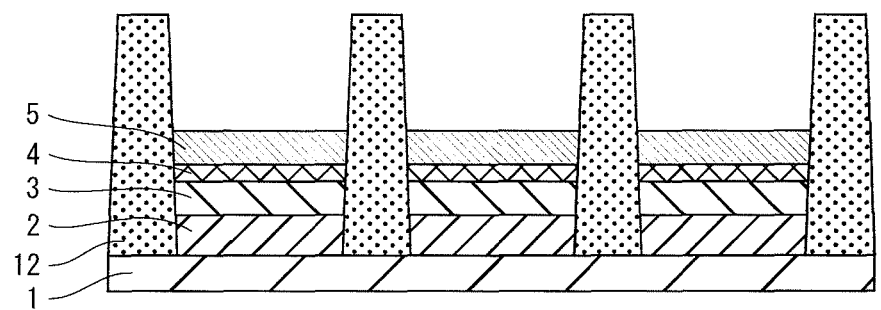

Next, on each of the transparent conductive layers 3, a hole injection layer 4, for example, is formed by the vapor deposition method, the sputtering method, or the like. Then, banks 12 are formed. Furthermore, on each of the hole injection layers 4, a hole transport layer 5, for example, is formed by a printing method such as the inkjet method (FIG. 19C). The respective hole injection layers 4 of the R, G, and B colors are set to have the same film thickness. Also, in Examples 1 and 2, the respective hole transport layers of the R, G, and B colors are set to have the same film thickness. In Example 3, the respective hole transport layers 5 of the R and G colors are set to have the same film thickness, and to have a different film thickness only from the hole transport layer 5 of the B color.

Figure 19D:
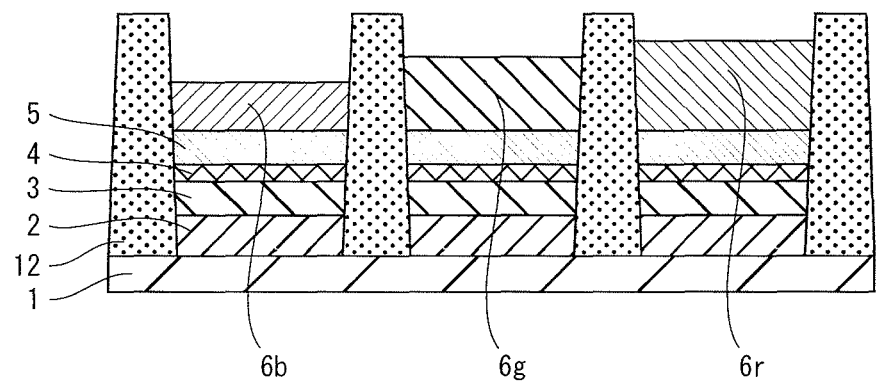

Next, on the respective hole transport layers 5, light-emitting layers 6b, 6g, and 6r, for example, are formed by a printing method such as the inkjet method (FIG. 19D). The respective organic light-emitting layers 6b, 6g, and 6r are each set to appropriately have a different film thickness.

Figure 20A:
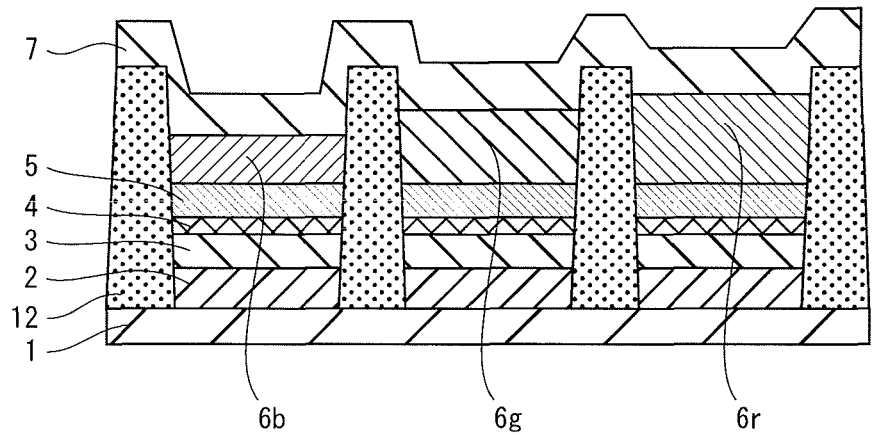
FIG. 20A to FIG. 20C show the method of manufacturing the organic EL panel according to the embodiment of the present invention.

Next, on the light-emitting layers 6b, 6g, and 6r, an electron transport layer 7 is formed by the vapor deposition method, the sputtering method, or the like (FIG. 20A). The respective electron transport layers 7 of the R, G, and B colors are set to have the same film thickness.

Figure 20B:
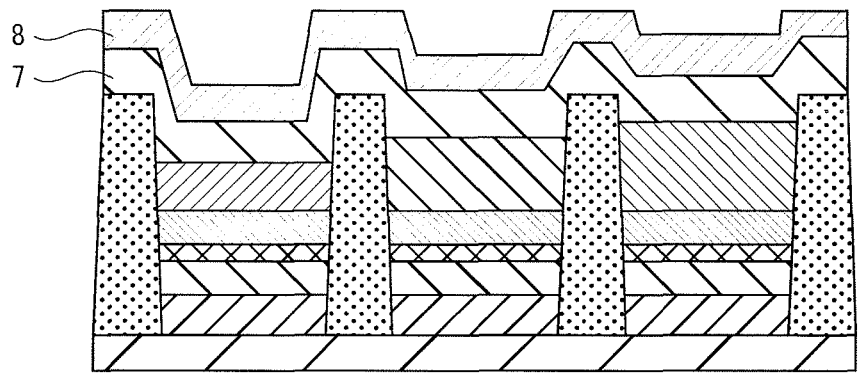

Next, on the electron transport layer 7, a transparent electrode 8 is formed by the vapor deposition method, the sputtering method, or the like (FIG. 20B). The transparent electrode 8 has a film thickness of 90 nm to 110 nm, for example.

Figure 20C:
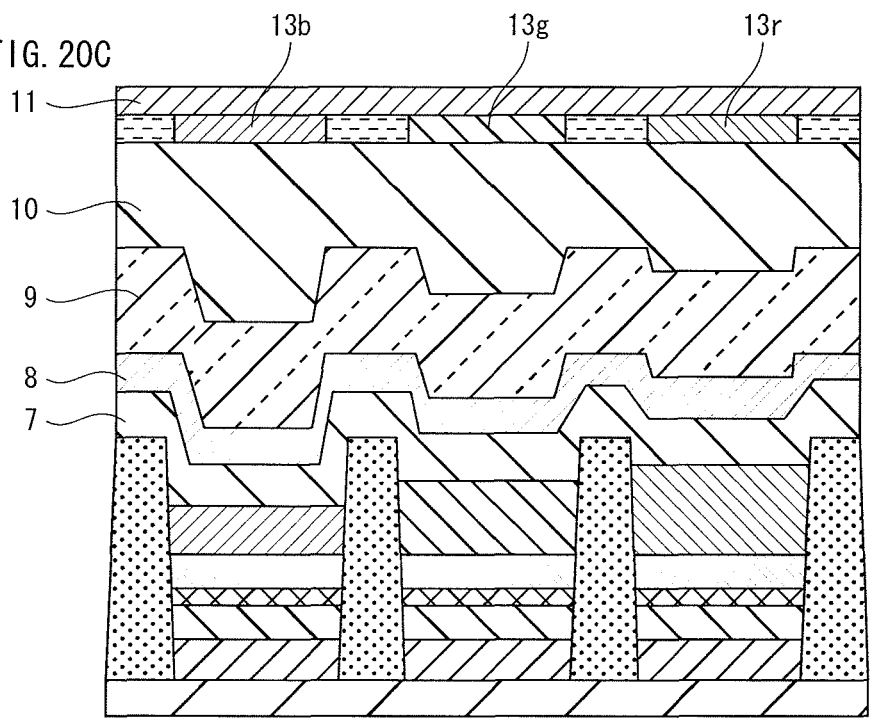

Next, a thin-film passivation layer 9 is formed on the transparent electrode 8 by the vapor deposition method, the sputtering method, or the like, and a substrate 11 in which color filters 13b, 13g, and 13r are formed is adhered thereto using a resin passivation layer 10 (FIG. 20C). These passivation layers each have a film thickness of 900 nm to 1100 nm, for example.

Although the present invention has been described based on the above embodiment, the present invention is not limited to the above embodiment. The present invention may include the following modification examples.

(1) In Example 1, the respective first functional layers of the R, G, and B colors each have a film thickness of 31.5 nm to 38.5 nm. The present invention is not limited to this. It is considered that the effect of increasing the light-extraction efficiency is exhibited due to the interference phenomenon that occurs between light traveling the first optical path C1 and light traveling the second optical path C2. This leads to an idea that what is important is not the film thickness of the first functional layer, but the optical distance between the organic light-emitting layer and the reflective electrode. The respective organic light-emitting layers of the R, G, and B colors each should have an optical distance of 57.6 nm to 70.4 nm from the reflective electrode. As long as this condition is satisfied, the same effect is exhibited even if the film thickness of the first functional layer is varied.

Also, in Example 2, the respective first functional layers of the R, G, and B colors each have a film thickness of 31.5 nm to 38.5 nm. The present invention is not limited to this. The respective organic light-emitting layers of the R, G, and B colors each should have an optical distance of 60.5 nm to 74.0 nm from the reflective electrode. As long as this condition is satisfied, the same effect is exhibited even if the film thickness of the first functional layer is varied.

Also, in Example 3, the respective first functional layers of the R and G colors each have a film thickness of 45 nm to 55 nm, and the first functional layer of the B color has a film thickness of 112.5 nm to 137.5 nm. The present invention is not limited to this. The respective first functional layers of the R and G colors each should have an optical distance of 86.4 nm to 105.6 nm from the reflective electrode, and the first functional layer of the B color should have an optical distance of 202.8 nm to 247.9 nm from the reflective electrode. As long as this condition is satisfied, the same effect is exhibited even if the film thickness of the first functional layer is varied.

Also, although the second functional layer has a film thickness of 27 nm to 33 nm, the present invention is not limited to this similarly. The respective organic light-emitting layers of the R, G, and B colors each should have an optical distance of 48.6 nm to 59.4 nm. As long as this condition is satisfied, the same effect is exhibited even if the film thickness of the second functional layer is varied.

(2) In the above embodiment, the first functional layer is constituted from the transparent conductive layer, the hole injection layer, and the hole transport layer. Alternatively, the first functional layer may not include any one of the transparent conductive layer, the hole injection layer, and the hole transport layer. Further alternatively, the first functional layer may further include another functional layer.

(3) In the above embodiment, the second functional layer is constituted from the hole transport layer. Alternatively, the second functional layer may further include an electron injection layer, for example.

Industrial Applicability

The present invention is applicable to organic EL displays and the like.

Reference Signs List 1 substrate
2 reflective electrode
3 transparent conductive layer
4 hole injection layer
5 hole transport layer
6b, 6g, and 6r organic light-emitting layer
7 electron transport layer
8 transparent electrode
9 thin-film passivation layer
10 resin passivation layer
11 substrate
12 bank
13b, 13g, and 13r color filter
15 organic display device
16 organic display panel
17 drive control unit
18 to 21 drive circuit
22 control circuit

The invention claimed is:

1. An organic electro luminescence (EL) panel, comprising:
   a first electrode of each of red (R), green (G), and blue (B) colors that reflects incident light;
   a second electrode that faces the first electrode of each of the R, G, and B colors, and transmits incident light therethrough;
   an organic light-emitting layer of each of the R, G, and B colors that is disposed between the first electrode of a corresponding color and the second electrode, and emits light of a corresponding color due to voltage application between the first electrode of the corresponding color and the second electrode;
   a functional layer of each of the R, G, and B colors that is disposed between the first electrode of a corresponding color and the organic light-emitting layer of a corresponding color;
   a color filter of each of the R, G, and B colors for chromaticity correction that is disposed opposite the organic light-emitting layer of a corresponding color with the second electrode being interposed therebetween, wherein
   a first portion of light of each of the R, G, and B colors emitted from the organic light-emitting layer of a corresponding color travels through the functional layer of a corresponding color towards the first electrode of a corresponding color, strikes and is reflected by the first electrode of the corresponding color, and then is emitted externally after passing through the functional layer of the corresponding color, the organic light-emitting layer of the corresponding color, the second electrode, and the color filter of a corresponding color,
   a second portion of the light of each of the R, G, and B colors travels towards the second electrode instead of towards the first electrode of the corresponding color, and is emitted externally after passing through the second electrode and the color filter of the corresponding color,
   the respective functional layers of the R, G, and B colors are equal in film thickness to one another,
   the film thickness of each of the respective functional layers of the R and G colors corresponds to a first local maximum of light-extraction efficiency with respect to the light of the corresponding color before passing through the color filter of the corresponding color,
   the film thickness of the functional layer of the B color corresponds to a value of light-extraction efficiency that is smaller than a first local maximum of light-extraction efficiency with respect to the light of the B color before passing through the color filter of the B color,
   the respective organic light-emitting layers of the R, G, and B colors differ in film thickness from one another, such that the respective functional layers of the R, G, and B colors are equal in film thickness to one another, and the light of each of the R, G, and B colors emitted externally after passing through the color filter of the corresponding color exhibits a local maximum of light-extraction efficiency.

2. The organic EL panel of claim 1, wherein
the film thickness of the functional layer of the B color is thinner than a film thickness corresponding to the first local maximum of light-extraction efficiency with respect to the light of the B color before passing through the color filter of the B color.

3. The organic EL panel of claim 2, wherein
the respective organic light-emitting layers of the R, G, and B colors have a film thickness of 81 nm to 99 nm, a film thickness of 63 nm to 77 nm, a film thickness of 36 nm to 44 nm, respectively, and the respective functional layers of the R, G, and B colors each have a film thickness of 31.5 nm to 38.5 nm.

4. The organic EL panel of claim 3, wherein
the functional layer of each of the R, G, and B colors includes a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each have a film thickness of 13.5 nm to 16.5 nm, the respective hole injection layers of the R, G, and B colors each have a film thickness of 4.5 nm to 5.5 nm, and the respective hole transport layers of the R, G, and B colors each have a film thickness of 13.5 nm to 16.5 nm.

5. The organic EL panel of claim 4, wherein
the first electrode of each of the R, G, and B colors is formed from silver or alloy of silver, and the transparent conductive layer of each of the R, G, and B colors is formed from indium tin oxide.

6. The organic EL panel of claim 2, wherein
the respective organic light-emitting layers of the R, G, and B colors have a film thickness of 81 nm to 99 nm, a film thickness of 72 nm to 88 nm, a film thickness of 36 nm to 44 nm, respectively, and the respective functional layers of the R, G, and B colors each have a film thickness of 31.5 nm to 38.5 nm.

7. The organic EL panel of claim 6, wherein
the functional layer of each of the R, G, and B colors includes a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each have a film thickness of 18 nm to 22 nm, the respective hole injection layers of the R, G, and B colors each have a film thickness of 4.5 nm to 5.5 nm, and the respective hole transport layers of the R, G, and B colors each have a film thickness of 9 nm to 11 nm.

8. The organic EL panel of claim 7, wherein
the first electrode of each of the R, G, and B colors is formed from aluminum or alloy of aluminum, and the transparent conductive layer of each of the R, G, and B colors is formed from indium zinc oxide.

9. The organic EL panel of claim 1, wherein
the organic light-emitting layer of each of the R, G, and B colors contains an organic material, and is formed by a printing method.

10. A display device with use of the organic EL panel of claim 1.

11. The organic EL panel of claim 1, wherein
the film thickness of the functional layer of the B color is not close to a film thickness at which local maximum light-extraction efficiency occurs when the color filter is not provided, and is close to a film thickness at which local maximum light-extraction efficiency occurs when the color filter is provided.

12. An organic electro luminescence (EL) panel, comprising:

a first electrode of each of red (R), green (G), and blue (B) colors that reflects incident light;

a second electrode that faces the first electrode of each of the R, G, and B colors, and transmits incident light therethrough;

an organic light-emitting layer of each of the R, G, and B colors that is disposed between the first electrode of a corresponding color and the second electrode, and emits light of a corresponding color due to voltage application between the first electrode of the corresponding color and the second electrode;

a functional layer of each of the R, G, and B colors that is disposed between the first electrode of a corresponding color and the organic light-emitting layer of a corresponding color;

a color filter of each of the R, G, and B colors for chromaticity correction that is disposed opposite the organic light-emitting layer of a corresponding color with the second electrode being interposed therebetween, wherein a first portion of light of each of the R, G, and B colors emitted from the organic light-emitting layer of a corresponding color travels through the functional layer of a corresponding color towards the first electrode of a corresponding color, strikes and is reflected by the first electrode of the corresponding color, and then is emitted externally after passing through the functional layer of the corresponding color, the organic light-emitting layer of the corresponding color, the second electrode, and the color filter of a corresponding color, a second portion of the light of each of the R, G, and B colors travels towards the second electrode instead of towards the first electrode of the corresponding color, and is emitted externally after passing through the second electrode and the color filter of the corresponding color, the respective functional layers of the R and G colors are equal in film thickness to each other, and differ in film thickness from the functional layer of the B color, with respect to the light of the corresponding color before passing through the color filter of the corresponding color, the film thickness of each of the respective functional layers of the R and G colors corresponds to a first local maximum of light-extraction efficiency, with respect to the light of the B color before passing through the color filter of the B color, the film thickness of the functional layer of the B color corresponds to a value of light-extraction efficiency that is smaller than a first local maximum of light-extraction efficiency and is larger than a second local maximum of light-extraction efficiency, where the first local maximum of light-extraction efficiency is larger than the second local maximum of light-extraction efficiency, the respective organic light-emitting layers of the R, G, and B colors differ in film thickness from one another, such that the respective functional layers of the R and G colors are equal in film thickness to each other, and differ in film thickness from the functional layer of the B color, and the light of each of the R, G, and B colors emitted externally after passing through the color filter of the corresponding color exhibits a local maximum of light-extraction efficiency.

13. The organic EL panel of claim 12, wherein
with respect to the light of the B color before passing through the color filter of the B color, the film thickness of the functional layer of the B color is thicker than a film thickness corresponding to the first local maximum of light-extraction efficiency and is thinner than a film thickness corresponding to the second local maximum of light-extraction efficiency.

14. The organic EL panel of claim 13, wherein
the functional layer of each of the R, G, and B colors includes a layer formed by a printing method and a layer formed by a physical vapor deposition method,
the respective layers of the R and G colors formed by the printing method are equal in film thickness to each other, and differ in film thickness from the layer of the B color formed by the printing method, and
the respective layers of the R, G, and B colors formed by the physical vapor deposition method are equal in film thickness to one another.

15. The organic EL panel of claim 14, wherein
the respective organic light-emitting layers of the R, G, and B colors have a film thickness of 54 nm to 66 nm, a film thickness of 36 nm to 44 nm, a film thickness of 90 nm to 110 nm, respectively, and
the respective functional layers of the R and G colors each have a film thickness of 45 nm to 55 nm, and the functional layer of the B color has a film thickness of 112.5 nm to 137.5 nm.

16. The organic EL panel of claim 15, wherein
the functional layer of each of the R, G, and B colors includes a transparent conductive layer formed on an anode that is the first electrode of the corresponding color, a hole injection layer formed on the transparent conductive layer, and a hole transport layer formed on the hole injection layer,
the respective transparent conductive layers of the R, G, and B colors each have a film thickness of 27 nm to 30 nm,
the respective hole injection layers of the R, G, and B colors each have a film thickness of 4.5 nm to 5.5 nm, and
the respective hole transport layers of the R and G colors each have a film thickness of 13.5 nm to 16.5 nm, and the hole transport layer of the B color has a film thickness of 81 nm to 99 nm.

17. The organic EL panel of claim 16, wherein
the first electrode of each of the R, G, and B colors is formed from aluminum or alloy of aluminum, and
the transparent conductive layer of each of the R, G, and B colors is formed from indium zinc oxide.

18. The organic EL panel of claim 12, wherein
the organic light-emitting layer of each of the R, G, and B colors contains an organic material, and is formed by a printing method.

19. A display device with use of the organic EL panel of claim 12.

20. A method of manufacturing an organic electro luminescence (EL) panel, comprising:
preparing a first electrode of each of red (R), green (G), and blue (B) colors that reflects incident light;
disposing a functional layer of each of the R, G, and B colors on the first electrode of a corresponding color;
disposing an organic light-emitting layer that emits light of each of the R, G, and B colors on the functional layer of a corresponding color;
disposing a second electrode that transmits incident light therethrough on the respective organic light-emitting layers of the R, G, and B colors so as to face the respective first electrodes of the R, G, and B colors; and
disposing a color filter of each of the R, G, and B colors for chromaticity correction so as to be opposite the organic light-emitting layer of a corresponding color with the second electrode being interposed therebetween, wherein
the functional layer is disposed such that (i) the respective functional layers of the R, G, and B colors are equal in film thickness to one another, the film thickness of each of the respective functional layers of the R and G colors corresponds to a first local maximum of light-extraction efficiency with respect to the light of the corresponding color before passing through the color filter of the corresponding color, and (ii) the film thickness of the functional layer of the B color corresponds to a value of light-extraction efficiency that is smaller than a first local maximum of light-extraction efficiency with respect to the light of the B color before passing through the color filter of the B color, and
the organic light-emitting layer is disposed such that (i) the respective organic light-emitting layers of the R, G, and B colors differ in film thickness from one another such that the respective functional layers of the R, G, and B colors are equal in film thickness to one another, and (ii) the light of each of the R, G, and B colors emitted externally after passing through the color filter of the corresponding color exhibits a local maximum of light-extraction efficiency.

21. A method of manufacturing an organic electro luminescence (EL) panel, comprising:
preparing a first electrode of each of red (R), green (G), and blue (B) colors that reflects incident light;
disposing a functional layer of each of the R, G, and B colors on the first electrode of a corresponding color;
disposing an organic light-emitting layer that emits light of each of the R, G, and B colors on the functional layer of a corresponding color;
disposing a second electrode that transmits incident light therethrough on the respective organic light-emitting layers of the R, G, and B colors so as to face the respective first electrodes of the R, G, and B colors; and
disposing a color filter of each of the R, G, and B colors for chromaticity correction so as to be opposite the organic light-emitting layer of a corresponding color with the second electrode being interposed therebetween, wherein
the functional layer is disposed such that (i) the respective functional layers of the R and G colors are equal in film thickness to each other, and differ in film thickness from the functional layer of the B color, (ii) with respect to the light of the corresponding color before passing through the color filter of the corresponding color, the film thickness of each of the respective functional layers of the R and G colors corresponds to a first local maximum of light-extraction efficiency, and (iii) with respect to the light of the B color before passing through the color filter of the B color, the film thickness of the functional layer of the B color corresponds to a value of light-extraction efficiency that is smaller than a first local maximum of light-extraction efficiency and is larger than a second local maximum of light-extraction efficiency, where the first local maximum of light-extraction efficiency is larger than the second local maximum of light-extraction efficiency, and the organic light-emitting layer is disposed such that (i) the respective organic light-emitting layers of the R, G, and B colors differ in film thickness from one another, such that the respective functional layers of the R and G colors are equal in film thickness to each other, and differ in film thickness from the functional layer of the B color, and (ii) the light of each of the R, G, and B colors emitted externally after passing through the color filter of the corresponding color exhibits a local maximum of light-extraction efficiency.

* * * * *